United States Patent
Suzuki et al.

(10) Patent No.: US 6,512,984 B1
(45) Date of Patent: Jan. 28, 2003

(54) BATTERY PACK, METHOD FOR CHARGING/DISCHARGING COUNTING AND METHOD FOR SETTING RESIDUAL CAPACITY OF THE BATTERY PACK

(75) Inventors: Mamoru Suzuki, Kanagawa (JP); Hideyuki Sato, Chiba (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/517,886

(22) Filed: Mar. 3, 2000

(30) Foreign Application Priority Data

Mar. 5, 1999 (JP) .......................... 11-059356
Mar. 5, 1999 (JP) .......................... 11-059358

(51) Int. Cl.$^7$ ............................................. G06F 19/00
(52) U.S. Cl. ...................... 702/63; 346/636; 346/637
(58) Field of Search ........................ 702/63; 340/636, 340/637

(56) References Cited

U.S. PATENT DOCUMENTS

| | | | |
|---|---|---|---|
| 4,031,450 A | * | 6/1977 | Hammel et al. ............... 320/23 |
| 4,377,787 A | * | 3/1983 | Kikuoka et al. ............. 324/431 |
| 4,803,416 A | * | 2/1989 | Abiven et al. ................. 320/44 |
| 5,592,094 A | | 1/1997 | Ichikawa |
| 5,648,717 A | | 7/1997 | Uskali ........................... 320/43 |
| 5,661,463 A | | 8/1997 | Letchak et al. |
| 5,675,258 A | | 10/1997 | Kadouchi et al. |
| 5,798,702 A | | 8/1998 | Okamoto et al. |
| 5,872,453 A | | 2/1999 | Shimoyama et al. |

FOREIGN PATENT DOCUMENTS

| | | |
|---|---|---|
| JP | 09-243718 A | 9/1997 |
| WO | WO 97/27659 | 7/1997 |

* cited by examiner

Primary Examiner—John S. Hilten
Assistant Examiner—Stephen J Cherry
(74) Attorney, Agent, or Firm—Lerner, David, Littenberg, Krumholz & Mentlik, LLP

(57) ABSTRACT

A battery pack and a residual battery capacity computing method. A correction coefficient associated with a temperature detected by a temperature detection unit is stored in the storage unit, the correction coefficient is read out and the residual battery capacity is computed based on the correction coefficient and the voltage detected by the voltage detection unit. If a correction coefficient associated with the detected temperature is not stored in the storage unit, a correction coefficient associated with a pre-set temperature ahead and at back of the detected temperature is read out from the storage unit to compute a correction coefficient associated with the detected temperature based on each read-out correction coefficient to compute the residual battery capacity based on the computed correction coefficient and the voltage detected by the voltage detection unit. If there is produced a temperature change in the battery cell, a correction coefficient can be acquired correctly in keeping with such change to enable the residual battery capacity to be computed accurately at all times.

18 Claims, 15 Drawing Sheets

BATTERY PACK, METHOD FOR CHARGING/DISCHARGING COUNTING AND METHOD FOR SETTING RESIDUAL CAPACITY OF THE BATTERY PACK

BACKGROUND OF THE INVENTION

1. Field of the Invention

This invention relates to a battery pack, a method for charging/discharging counting and a method for setting the residual capacity of the battery pack.

2. Description of Related Art

Up to now, there has been furnished a battery pack having battery cells as secondary batteries, such as lithium ion cells, NiCd cells or nickel hydrogen cells.

The battery pack usually includes a micro-computer for performing calculations of the residual battery capacity of the battery cells or communication with an electronic equipment having the battery cell as a power source, peripherals of the micro-computer and a battery cell status detection circuit necessary in carrying out calculations of the residual battery capacity.

The number of charging/discharging cycles of the battery pack is not infinite. On the other hand, the maximum number of times of the charging/discharging cycles, capable of maintaining practically tolerable charging/discharging characteristics, is determined to some extent depending on the sort etc of the battery cell.

In the conventional battery pack, it has been difficult for the user to recognize the maximum number of times of the charging/discharging cycles, capable of maintaining practically tolerable charging/discharging characteristics, that is the service life of the battery cell. The user is only able to recognize the approaching end of service life of the battery cell, as the charging/discharging is repeated, only on recognizing that battery capacity is decreasing at a faster rate even though the cell has been charged to its full capacity.

In order to permit the user to recognize the service life of the battery cell easily, the present Applicant has proposed in Japanese Laying-Open Patent H-9-243718 a battery pack and a method for displaying the state of the battery, referred to below as the first disclosed technique.

The first disclosed technique, shown in FIG. 1, detects that the voltage of the battery cell has exceeded the first threshold voltage, and further detects that the voltage has become lower than a second threshold voltage. The first disclosed technique counts the number of times of charging/discharging on the assumption that one cycle of charging or discharging occurred when one of the voltage states is detected after detecting the other voltage state.

On the other hand, in a battery pack having plural battery cells, the maximum charging voltage differs from one battery cell to another. Thus, the present Assignee proposed in Japanese Laying-Open Patent H-9-285026 a battery charging method and apparatus and a battery pack, referred to below as the second disclosed technique.

In the second disclosed technique, the residual battery capacity is computed based on the charging of the battery cell and the initial value stored in the battery cell.

The battery pack is loaded on an electronic equipment, such as a video camera device, to furnish the current to the equipment. If the power source has become depleted, the battery pack is charged. This battery pack has a battery cell, as a chargeable and dischargeable secondary battery, and a micro-computer for detecting the voltage of the battery cell to compute the residual battery capacity.

Since the residual battery capacity is varied appreciably with temperature, it is computed using a temperature dependent coefficient of the battery cell, as stated for example in Japanese Laying-Open Patent H-9-297166. This temperature dependent residual capacity correction coefficient is referred to below as the correction coefficient. Since this correction coefficient differs in magnitude with temperature, the correction coefficient for each increment of 10° C. is stored in a non-volatile memory, such as ROM. The microcomputer computes the residual battery capacity using the correction coefficient stored in the non-volatile memory and which corresponds to the current temperature.

However, in the first disclosed technique, count-up is made only when the battery cell voltage falls below the second threshold value, such that, if the battery cell is charged before the cell voltage falls below the second threshold value, count-up is not made. Thus, there is raised a problem that, even though the battery cell is deteriorated due to charging/discharging, the cycle is not counted correspondingly. Although it may be attempted to set the second threshold to a higher value, count-up then occurs while as yet there is left sufficient battery power, such that count-up cannot be made correctly.

On the other hand, the conventional battery pack is designed so that, once the charging is made up to 90%, this 90% charging is deemed to be full charging, in order to absorb errors in current detection etc in charging. Thus, in the battery pack, the integrated value of the residual battery capacity on 90% charging is previously stored in the ROM and, if it is verified that charging up to 90% has been made, the battery capacity is set as :the integrated residual battery capacity value.

However, if the charging/discharging is repeated, the battery cell is deteriorated, such that the battery capacity that can be retrieved actually is decreased. With this battery cell deterioration, the integrated residual battery capacity on 90% charging is lowered, thus producing a gap between the integrated residual battery capacity on 90% charging stored in the non-volatile memory and the actual integrated residual battery capacity.

If the residual battery capacity is computed based on the initial value stored in the battery cell at the time of charging, in accordance with the second disclosed technique, there is presented a problem that the residual battery capacity cannot be computed correctly.

SUMMARY OF THE INVENTION

It is therefore an object of the present invention to provide a battery pack in which, if a battery cell is deteriorated due to charging/discharging, the number of cycles is counted depending on the deterioration, and in which the residual battery capacity can be accurately set depending on the deterioration.

Ii is another object of the present invention to provide a method for counting the number of times of charging/discharging in the battery pack, and a method for setting the residual battery capacity of the battery pack.

In one aspect, the present invention provides a battery pack including voltage detection means for detecting the voltage of a battery cell, storage means for storing a correction coefficient for calculating the residual battery capacity for a pre-set temperature, temperature detection means for detecting the temperature of the battery cell and computing means. This computing means operates so that, if a correction coefficient associated with a temperature detected by the temperature detection means is stored in the storage means, the computer means reads out the correction coefficient to compute the residual battery capacity based on the correction coefficient and the voltage detected by the voltage detection means. The computing means also operates so that, if a correction coefficient associated with a temperature detected by the temperature detection means is not stored in the storage means, the computer means reads out a correction coefficient associated with a pre-set temperature ahead and at back of the detected temperature from the storage means to compute a correction coefficient associated with the detected temperature based on each read-out correction coefficient to compute the residual battery capacity based on the computed correction coefficient and the voltage detected by the voltage detection means.

In another aspect, the present invention provides a method for computing the residual battery capacity of a battery pack associated with a pre-set temperature including storing a correction coefficient for calculating the residual battery capacity for a pre-set temperature, and detecting the temperature of the battery cell, wherein, if a correction coefficient associated with a temperature detected by the temperature detection means is stored in the storage means, the correction coefficient is read out and the residual battery capacity is computed based on the correction coefficient and the voltage detected by the voltage detection means. Also, if a correction coefficient associated with the detected temperature is not stored in the storage means, a correction coefficient associated with a pre-set temperature ahead and at back of the detected temperature is read out from the storage means to compute a correction coefficient associated with the detected temperature based on each read-out correction coefficient to compute the residual battery capacity based on the computed correction coefficient and the voltage detected by the voltage detection means.

DESCRIPTION OF THE PREFERRED EMBODIMENTS

Figure 1:
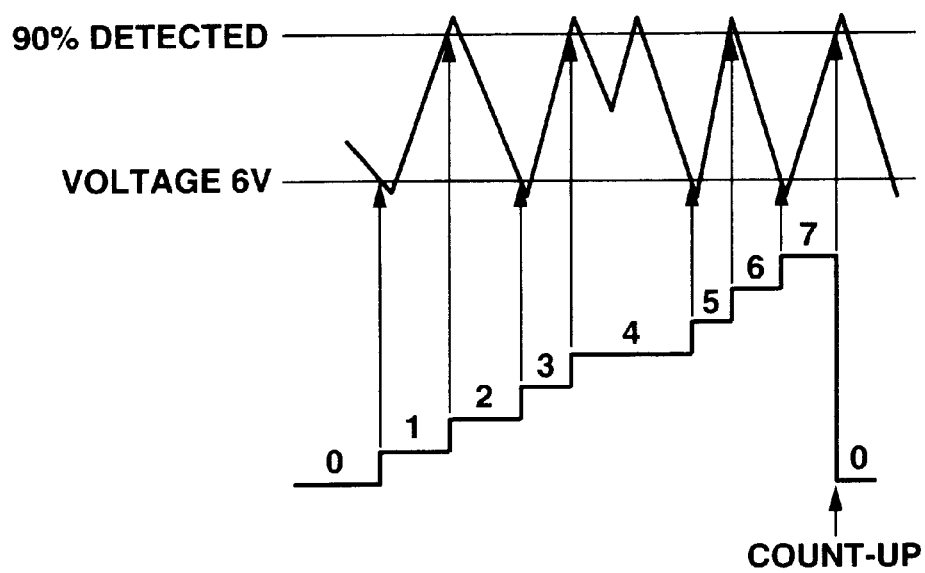
FIG. 1 illustrates the manner of counting of the number of cycles in the related art.

Referring to the drawings, preferred embodiments of according to the present invention will be explained in detail.

Figure 3:
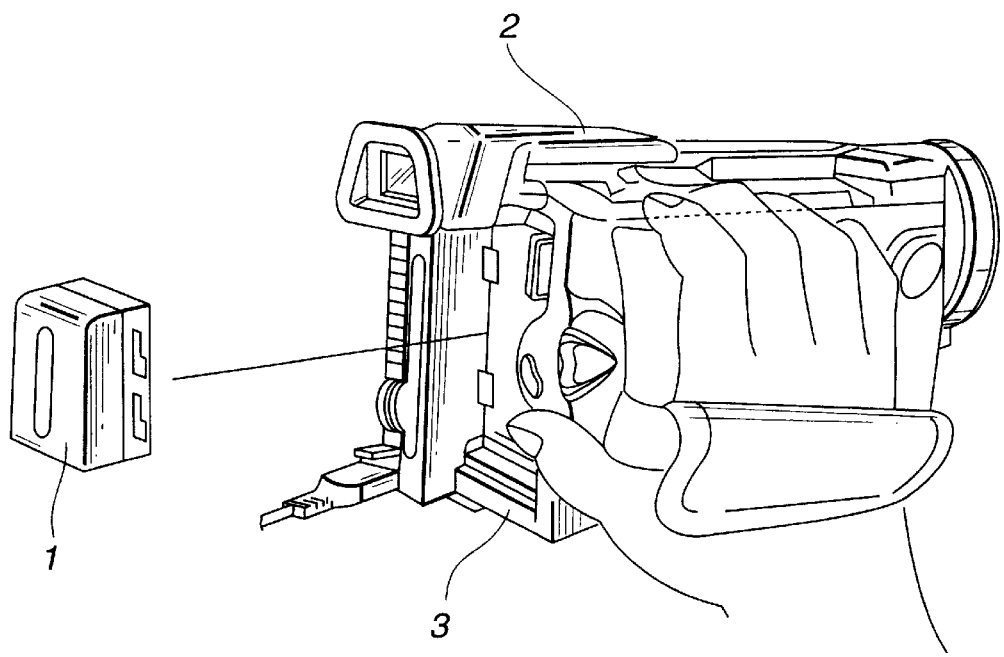
FIG. 3 illustrates the state of loading a battery pack embodying the present invention on a video camera device.

The present invention is applicable to, for example, a battery pack 1 shown in FIG. 3. This battery pack 1 is loaded on a battery loading unit 3 of, for example, a video camera device 2, to supply the power to the video camera device 2. On the other hand, the battery pack 1 can be loaded on a charging device, not shown, for charging.

Figure 4:
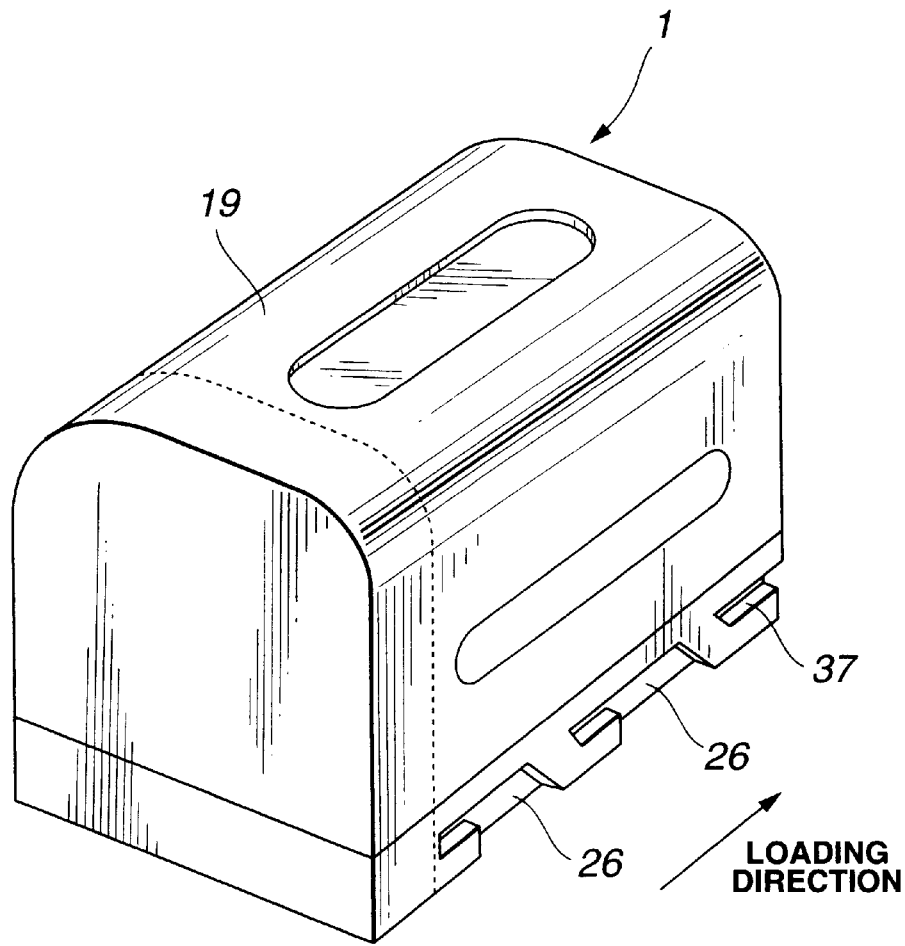
FIG. 4 is a perspective view of a battery pack.

The battery pack 1 includes a casing 19, as shown in FIG. 4. The casing 19 accommodates therein a battery cell, not shown.

The casing 19 of the battery pack 1 is formed of, for example, a synthetic resin material. In both width wise lateral sides of the casing 19 are formed guide grooves 26, 26 for guiding the loading relative to the battery loading unit 3. The guide grooves 26, 26 in the respective lateral sides are opened at one ends thereof in a bottom surface 24 of the casing 19 and are formed side-by-side along the length of the casing 19.

On both width-wise lateral sides of the casing 19 on a front surface 20 along the loading direction relative to the battery loading unit 3, there are provided a first input/output terminal 21 and a second input/output terminal 22. At a mid portion along the width-wise direction, there is provided a communication terminal 23.

The first and second input/output terminals 21, 22 furnish the power to a main body portion of the video camera device 1 through the battery loading unit 3. The communication terminal 23 outputs information signals, such as residual power of the battery cell, to the main body portion of the video camera device 1. The one ends of the input/output terminals 21, 22 and the communication terminal 23 facing outwards are positioned in substantially rectangular recesses formed in the front surface 20 of the casing 19 and thereby prevented from being destroyed due to abutting contact on other portions of the battery loading device other than the connection terminals.

In the front side of the bottom surface 24 of the casing 19, that is in the front surface along the lengthwise direction, there are formed a pair of control recesses 28, 29. These control recesses 28, 29 are formed line-symmetrically with respect to a mid line, not shown, in the width-wise direction, as shown in FIG. 3. In loading, these control recesses 28, 29 are engaged by control projections, not shown, of the battery loading unit 3, to limit the tilt in the width-wise direction of the bottom surface 24 of the casing 19 relative to the battery loading unit 3.

Figure 5:
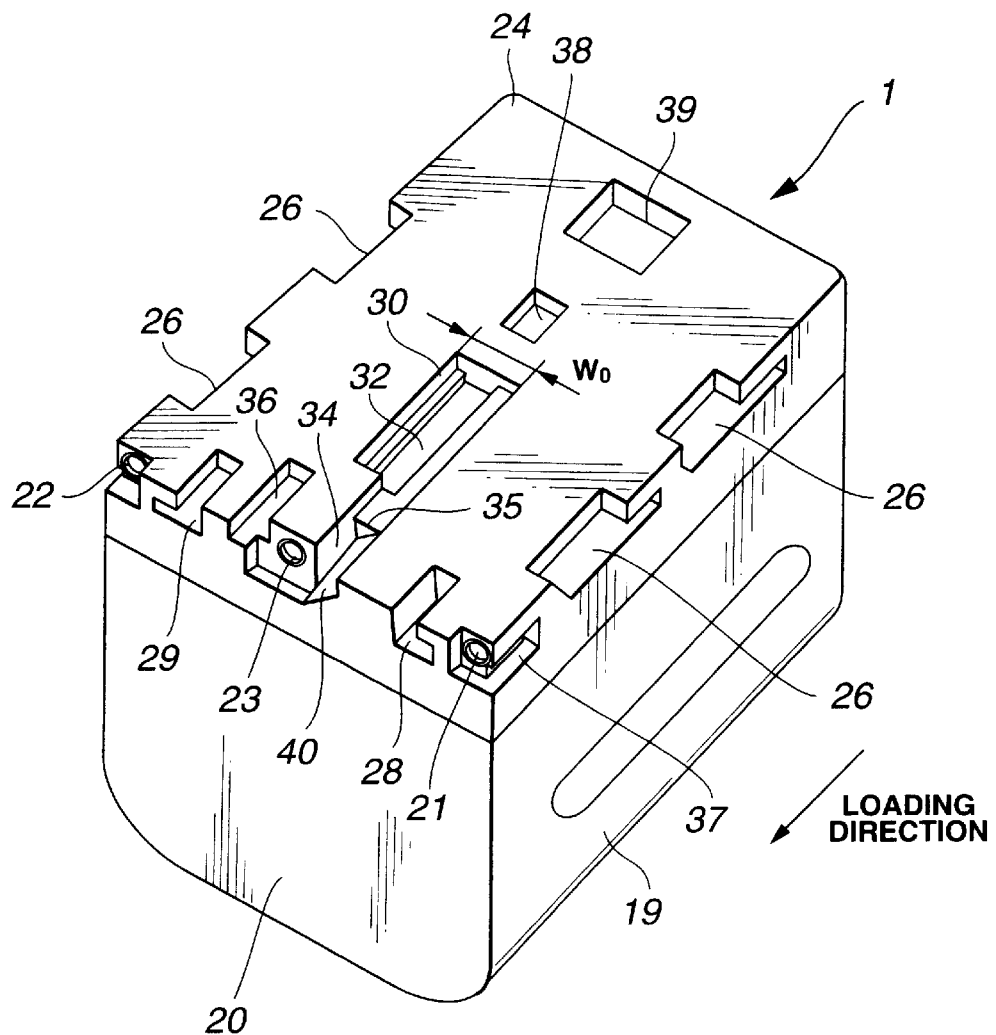
FIG. 5 is a perspective view showing the back side of the battery pack.

These control recesses 28, 29 are each substantially of an L-shape made up of a first portion perpendicular to the bottom surface 24 of the casing 19 and a second portion perpendicular to this first portion, as shown in FIG. 5.

In a mid portion of the bottom surface 24 of the casing 19 is formed a substantially rectangular discriminating recess 30 for discriminating whether or not the battery loading unit is an appropriate unit.

The discriminating recess 30 is positioned at a position on a mid line in the width-wise direction of the casing 19 lying closer to the front surface 20 from the mid point of the bottom surface 24 of the casing 19. In the bottom surface within the discriminating recess 30 is formed a substantially rectangular discriminating groove 32 in continuation to both longitudinal ends of the recess 30 substantially on the centerline along the width-wise direction of the casing 19. On both sides in the width-wise direction of the bottom surface 24 of the casing 19, there are formed steps in the discriminating recess 30. The discriminating recess 30 has a width-wise size of $W_0$.

Adjacent to the communication terminal 23 is formed a first guide groove 34 extending parallel to the longitudinal direction of the casing 19. This first guide groove 34 has its one end opened in the front surface 20 of the casing 19, while having its other end formed in continuation to the discriminating recess 30. Adjacent to the front surface 20 of the casing 19 is formed in the first guide groove 34 a step 35 different in depth in the depth-wise direction corresponding to the direction perpendicular to the bottom surface 24 of the casing 19. This first guide groove 34 guides the battery pack loading direction relative to the battery loading unit 3.

In the bottom surface 24 of the casing 19 is formed a second guide groove 36 facing the first guide groove 34 with the communication terminal 23 in-between. This second guide groove 36 is formed parallel to the longitudinal direction of the bottom surface 24 of the casing 19 so that its one end is opened in the front surface 20 of the casing 19.

In both lateral sides in the width-wise direction of the casing 19 are formed control grooves 37, 37 adjacent to the first and second input/output terminals 21, 22. The control grooves 37, 37 are opened in the front surface 20, while extending substantially parallel to the bottom surface 24 of the casing 19, for limiting the tilt in the width-wise direction of the bottom surface 24 relative to the battery loading unit 3.

In the bottom surface 24 of the casing 19 are formed a first lock recess 38 and a second lock recess 39 engaged by the battery loading unit 3 on loading the battery pack on the battery loading unit 3. The first lock recess 38 is substantially rectangular in profile and is positioned neighboring to the discriminating recess 30 on a width-wise mid line of the casing 19. The second lock recess 39 is substantially rectangular in profile and is slightly larger in size than the first lock recess 38. The second lock recess 39 is formed close to the back side looking along the loading direction on a width-wise mid line of the casing 19.

On the other hand, the battery loading unit 3 provided on the camera device 2 is slightly larger in size than the bottom surface 24 of the casing 19. The battery loading unit 3 is provided on both lateral sides facing both width-wise lateral sides of the battery pack 1 with a pair of guide projections 47 engaging in the guide grooves 26, 26 of the battery pack 1.

When loading the battery pack on the battery loading unit 3, the guide projections 47 are intruded into the guide grooves 26, 26 of the casing 19 to guide the intruding direction to hold the battery pack 1 with the bottom surface 24 of the casing 19 substantially parallel to a setting surface 45.

On the side of an abutting surface 46 of the battery loading unit 3 facing the front surface 20 of the battery pack 1 is formed a terminal portion 44. This terminal portion 44 is made up of first to third connection terminals 51 to 53 and a cover member 60.

The first and second connection terminals 51, 52 are provided on both sides along the width of the battery loading unit 3 for connection to the first and second input/output terminals 21, 22, respectively. The third connection terminal 53 is positioned at a mid point in the width-wise direction of the battery loading unit 3 for connection to the communication terminal 23 of the battery pack 1. The first to third connection terminals 51 to 53 are provided on the abutting surface 46 of the battery loading unit 3 parallel to the bottom surface 24 and to the longitudinal of the battery pack 1.

The cover member 60 is mounted on the battery loading unit 3 for rotation in the direction indicated by arrows a1, a2 to protect the first to third connection terminals 51 to 53 from outside.

The cover member 60 is formed of, for example, a synthetic resin material, and is made up of a substantially rectangular protection piece 61 and supporting pieces 62, 62 for supporting the protection piece 61. The surface of the protection piece 61 of the cover member 60 facing the setting surface 45 of the battery loading unit 3 is formed with a surface inclined with respect to the thickness direction. When the battery pack 1 is loaded on the battery loading unit 3, the casing 19 compresses against the protection piece 61 to permit the cover member 60 to be rotated easily in the direction indicated by arrow a2. The supporting pieces 62, 62 of the cover member 60 are supported by the abutting surface 46 of the battery loading unit 3 for rotation about a pivot shaft, not shown. A torsion coil spring, not shown, is provided on the outer periphery of the pivot shaft of the cover member 60. This torsion coil spring has its one end retained by the abutting surface 46 of the battery loading unit 3, while having its other end retained by the supporting pieces 62, 62 of the cover member 60. Thus, the cover member 60 is biased in the direction indicated by arrow a1 under the elasticity of the torsion coil spring to overlie the first to third connection terminals 51 to 53.

The battery loading unit 3 is formed with a pair of control projections 65, 66 astride the abutting surface 46 and the setting surface 45, substantially line-symmetrically with respect to the centerline, so as to be engaged in the control recesses 28, 29 of the battery pack 1.

These control projections 65, 66 are each substantially of an L-shape made up of a first portion perpendicular to the setting surface 45 and a second portion perpendicular to this first portion. These control projections 65, 66 restrict the bottom surface 24 of the battery pack 1 from being tilted in the width-wise direction with respect to the setting surface 45 of the battery loading unit 3.

The battery loading unit 3 is also formed with a first guide projection 68, neighboring to the third connection terminal 53, astride the abutting surface 46 and the setting surface 45, for guiding the intrusion of the battery pack 1. This first guide projection 68 is formed parallel to the longitudinal direction of the setting surface 45 for engaging in the first guide groove 34 of the bottom surface 24 of the battery pack 1 being loaded, as shown in FIG. 4.

The battery loading unit 3 is also formed with a second guide projection 54, astride the abutting surface 46 and the setting surface 45, for guiding the loading direction of the battery pack 1. The second guide projection 54 is formed as one with the setting surface 45 parallel to its longitudinal direction. This second guide projection 54 is engaged in the second guide groove 36 of the battery pack 1 to guide the loading direction.

Both lateral sides along the width of the battery loading unit 3 are formed as one with control pawls 55, 55 engaged in the control grooves 37, 37. The control pawls 55, 55 are parallel to the setting surface 45 and to the longitudinal direction of the battery pack 1.

Figure 6:
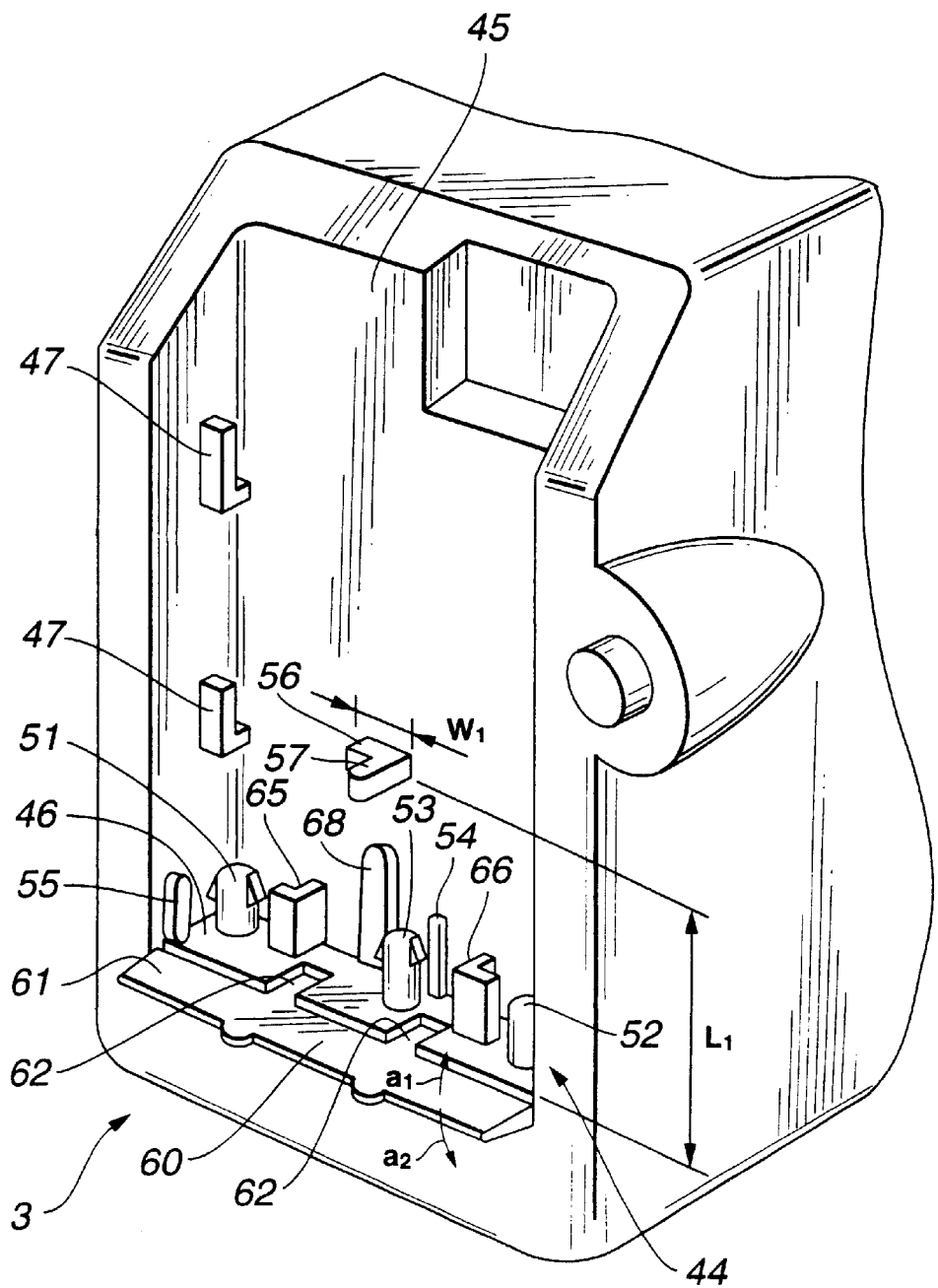
FIG. 6 is a perspective view of a battery loading unit provided in the video camera device.

At a mid portion of the setting surface 45 of the battery loading unit 3, there is formed a discriminating projection 56 engaged in the discriminating recess 30 of the first battery pack 6. This discriminating projection 56 is substantially rectangular in profile. The distal end of the discriminating projection 56 is formed as one with a discriminating lug 56 engaged in the discriminating groove 32 of the battery pack 1. This discriminating projection 56 has a width $W_1$ parallel to the width of the setting surface 45 smaller than the width $W_0$ of the discriminating recess 30 of the battery pack 1, so that the discriminating projection 56 can be intruded into the discriminating recess 30, as shown in FIG. 6. The discriminating projection 56 is formed at a position spaced a distance L1 from the abutting surface 46 in the vertical direction.

With the above-described structure of the battery loading unit 3, the battery pack 1 can be loaded on the battery loading unit 3.

The charging device for charging the battery pack 1 is also provided with a battery loading unit constructed similarly to the battery loading unit 3.

The circuit structure of the battery pack 1 is hereinafter explained.

Figure 7:
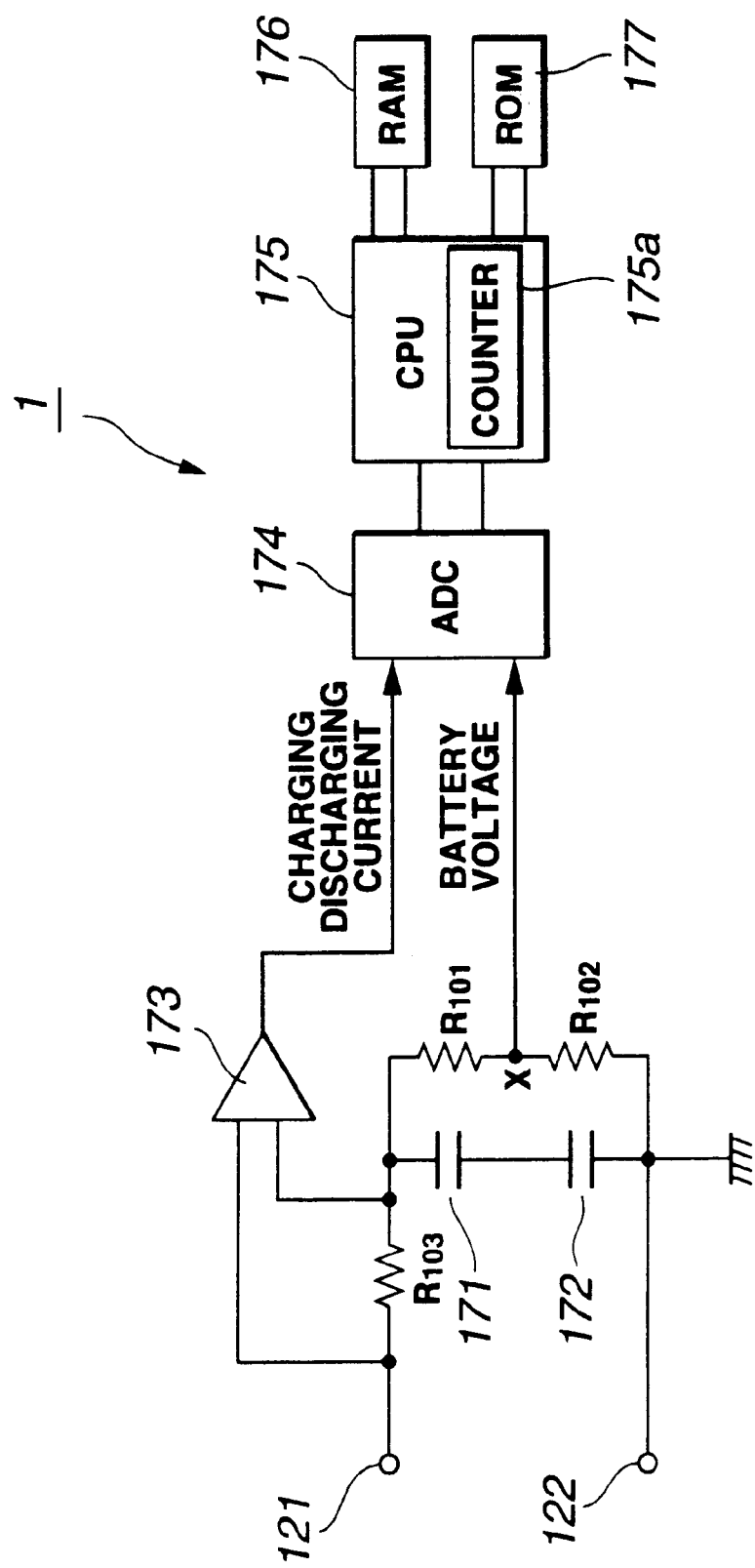
FIG. 7 illustrates the circuit structure of the battery pack.

Referring to FIG. 7, the battery pack 1 is provided with lithium ion batteries 171, 172, as two serially connected battery cells, a first input/output terminal 121 connected to the positive terminal of the lithium ion battery 171 through a resistor R101 and a second input/output terminal 122 connected to the negative electrode of the lithium ion battery 172.

The lithium ion batteries 171, 172 are charged from outside or discharged to outside through the first and second input/output terminals 121, 122. The lithium ion batteries 171, 172 are connected in parallel with serially connected resistors 101, 102. That is, the positive electrode of the lithium ion battery 171 is connected to the resistor R101, whilst the negative electrode of the lithium ion battery 172 is connected to the resistor 102.

The battery pack 1 is also provided with a current detection circuit 173 for detecting the current flowing through the resistor 103, an A/D converter 174 for digitizing the charging/discharging current value and the battery voltage value and a central processing unit (CPU) 175 for counting the number of times of charging/discharging, referred to below as the number of cycles, and calculating the residual battery capacity. The battery pack 1 also includes a random access memory (RAM) 176 for transiently storing the current voltage levels of the lithium ion batteries 171, 172 and a read-only memory (ROM) 177 having stored therein the control program for the CPU 175.

The current detection circuit 173 detects the current flowing in the resistor 103 during charging or discharging to route the detected current to an A/D converter 174.

The A/D converter 174 digitizes the current value from the current detection circuit 173 to route the digitized current to the CPU 175. The A/D converter 174 digitizes the voltage value of a connection terminal of the resistors 101, 102, referred to below as a mid point connection terminal, that is the divided voltage value R102/(R101+R102) of the terminal voltage of the series connected lithium ion batteries 101, 102, to route the digitized voltage to the CPU 175.

The CPU 175 is provided with a counter 175a for counting the number of cycles. The CPU 175 divides the voltage level of the mid point connection terminal X into four stages of the battery level 0 to the battery level 3, with the highest battery level being a battery level 3 and with the lowest battery level being a battery level 0. The CPU 175 counts up one by a counter 75a each time the battery level is decremented by one.

Figure 9:
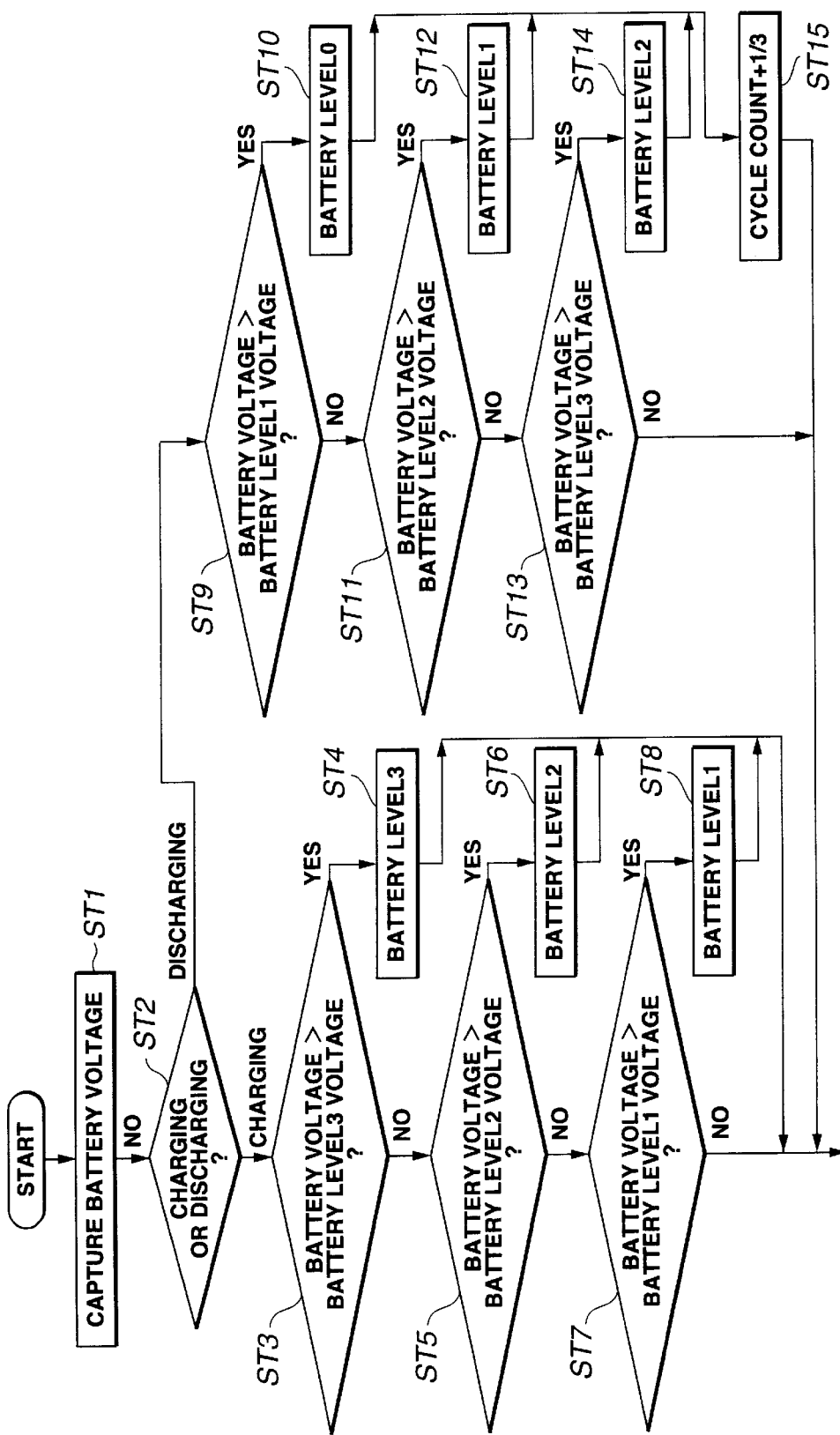
FIG. 9 is a flowchart for illustrating the operating contents of the battery level setting and the cycle counting.

Specifically, the CPU 175 sets the battery level in accordance with the flowchart shown in FIG. 9 to count the number of cycles.

When the current detection circuit 173 detects the charging current of the discharging current, the CPU 175 moves to step ST1 to capture the battery voltage at the mid point connection terminal X through the A/D converter 174. The CPU then advances to step ST2.

At step ST2, the CPU 175 verifies whether charging is going on or discharging is going on, based on a detection output of the current detection circuit 173. If the CPU 175 verifies that the charging is going on, the CPU advances to step ST3. If the CPU 175 verifies that the discharging is going on, the CPU advances to step ST9.

At step ST3, the CPU 175 checks whether or not the voltage level at the mid point connection terminal X is higher than the battery voltage level 3. If the result is YES, the CPU 175 advances to step ST4 and, if otherwise, to step ST5.

At step ST4, the CPU 175 assumes the current voltage level to be the battery level 3 to write the level in the RAM 176 to terminate the processing.

At step ST5, the CPU 175 checks whether or not the voltage levelat the mid point connection terminal X is higher than the battery voltage level 2. If the result is YES, the CPU 175 advances to step ST6 and, if otherwise, to step ST7.

At step ST6, the CPU 175 assumes the current voltage level to be the battery level 2 to write the level in the RAM 176 to terminate the processing.

At step ST7, the CPU 175 checks whether or not the voltage level at the mid point connection terminal X is higher than the battery voltage level 1. If the result is YES, the CPU 175 advances to step ST8 and, if otherwise, the CPU 175 assumes the current voltage level to be the battery level 0 and writes the level in the RAM 176 to terminate the processing.

At step ST8, the CPU 175 assumes the current voltage level to be the battery level 1 to terminate the processing.

At step ST9, to which the CPU 175 advances when it is verified that discharging is going on at step ST2, the CPU 175 verifies whether or not the voltage level at the mid point connection terminal X is lower than the battery voltage level 1, that is whether or not the battery level has transferred from 1 to 0. If the result of check is YES, the CPU advances to step ST10 and, if otherwise, to step ST11.

At step ST10, the CPU 175 assumes that the current battery voltage is the battery level 0 to write the level in the RAM 176. The CPU then advances to step ST15.

At step ST11, the CPU 175 verifies whether or not the voltage level at the mid point connection terminal X is smaller than the battery voltage level 2, that is whether or not the battery level has transferred from level 2 to level 1. If the result of check is YES, the CPU moves to step ST12 and, if otherwise, to step ST13.

At step ST12, the CPU 175 assumes that the current battery voltage is the battery level 1 to write the level in the RAM 176. The CPU then advances to step ST15.

At step ST13, the CPU 175 verifies whether or not the voltage level at the mid point connection terminal X is smaller than the battery voltage level 3, that is whether or not the battery level has transferred from level 3 to level 2. If the result of check is YES, the CPU moves to step ST14 and, if otherwise, it terminates the processing.

At step ST14, the CPU 175 assumes that the current battery voltage is the battery level 0 to write the level in the RAM 176. The CPU then advances to step ST15.

At step ST15, the CPU 75 counts up the number of cycles of the counter 175a by ⅓ to terminate the processing.

That is, the CPU 175 detects to which of the battery levels the voltage level belongs at the time of charging and discharging, and counts up by ⅓ each time the voltage level is lowered due to discharging, such that any one of the three threshold values is exceeded. Thus, if the lithium ion secondary batteries are charged/discharged frequently, the number of cycles can be counted up responsive to the states of actual deterioration of the lithium ion secondary batteries.

Figure 10:
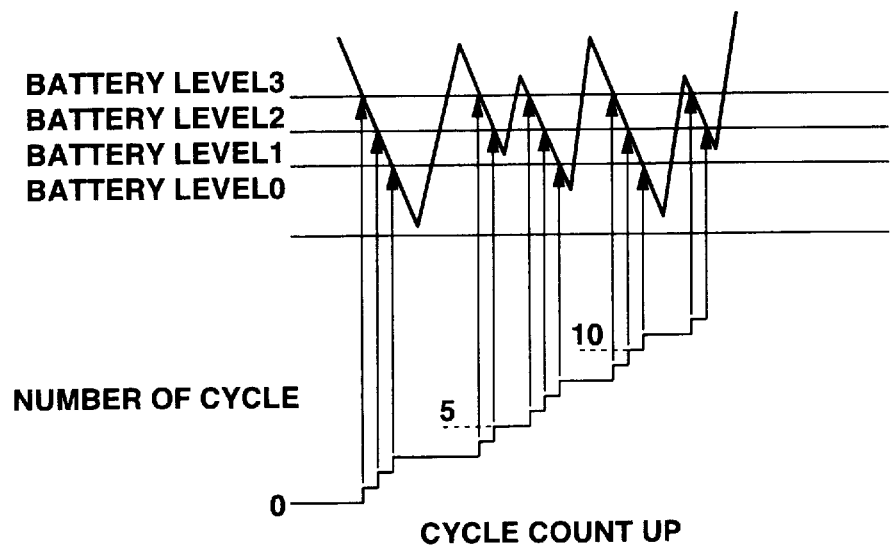
FIG. 10 illustrates the counting of the number of cycles.

The number of cycles is counted upeach time the battery level transfers from. 3 to 2, from 2 to 1 and from 1 to 0. If, after the battery level is 3 by charging, discharging occurs again, the number of cycles is counted up each time the battery level transfers from 3 to 2 and from 2 to 1. If, charging takes place again at the battery level equal to 1, so that the battery level transfers to 3, the discharging then taking place again, the number of cycles is counted up each time the battery level number is decremented. Meanwhile, one-third of the number of cycles shown in FIG. 10 represents the actual number of cycles.

If the number of cycles of the counter 175a of the CPU 175 exceeds the maximum number of charging/discharging counts of the lithium ion batteries 171, 172, it may be assumed that the lithium ion batteries 171, 172 have been deteriorated and the service life thereof has come to an end.

In the present embodiment the battery level is divided into four stages. Alternatively, the battery level can be divided into n (>2) stages and the number of cycles can be counted up each time one of the (n−1) thresholds has been exceeded.

Also, in the present embodiment, the number of cycles is counted up as the voltage level is lowered, that is during discharging. Alternatively, the number of cycles can be counted as the voltage level is increased, that is during charging. Still alternatively, the number of cycles can be counted both during charging and discharging.

Figure 11:
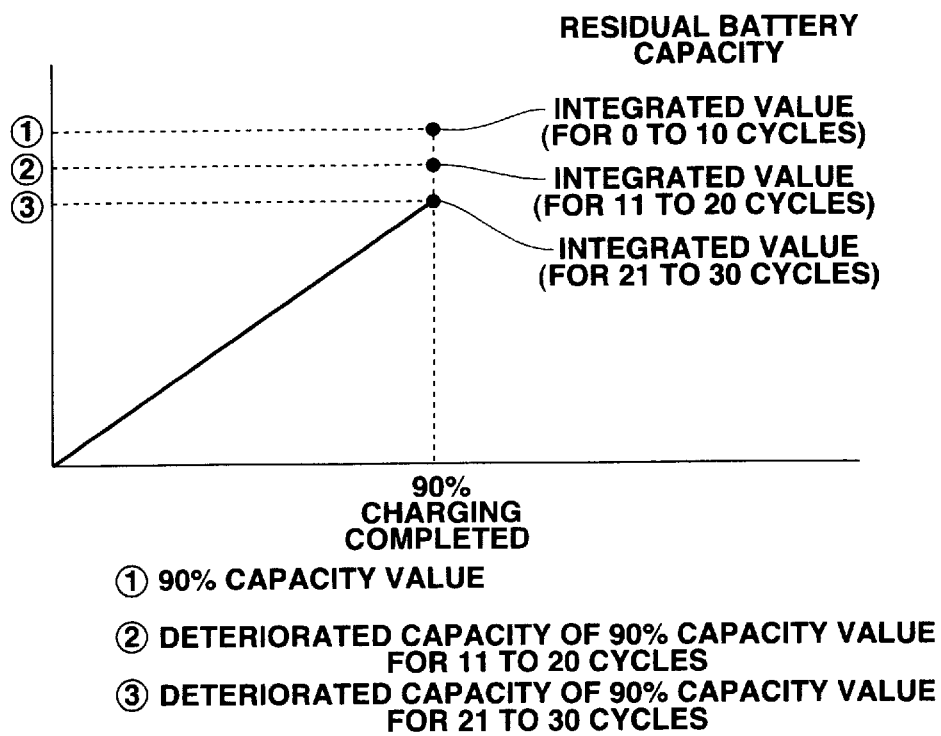
FIG. 11 illustrates an example of changes in the integrated residual battery capacity with respect to the number of cycles.

The integrated residual battery voltage value, stored in the ROM 177, is hereinafter explained. The integrated residual battery voltage [mAh] that can be discharged at the time of 90% charging, referred to below as the 90% integrated residual value, is stored in the ROM 177 for each cycle number, as shown in FIG. 11. Here, the 90% integrated residual value is stored at an interval of 10 cycles, specifically for the numbers of cycles from 0 to 10, from 11 to 20, from 21 to 30, . . .

For example, the 90% integrated residual value from 11 to 20 cycles is the 90% integrated residual value for 0 to 10 cycles less the deteriorated capacity of the lithium ion batteries 171, 172 caused by the 11 to 20 cycles. Similarly, the 90% integrated residual value from 11 to 20 cycles is the 90% integrated residual value for 0 to 10 cycles less the deteriorated capacity of the lithium ion batteries 171, 172 caused by the 21 to 30 cycles.

Thus, if the residual battery value is computed in discharging, based on the initial value of the integrated residual battery value, the battery pack 1 is able to make calculations using the 90% integrated residual value as set based on the number of cycles. That is, since the 90% integrated residual value, as an initial value for calculating the residual battery value, can be set in keeping with the deterioration due to charging/discharging of the lithium ion batteries 171, 172, the residual battery value can be calculated more acurately than with the conventional method.

Figure 12:
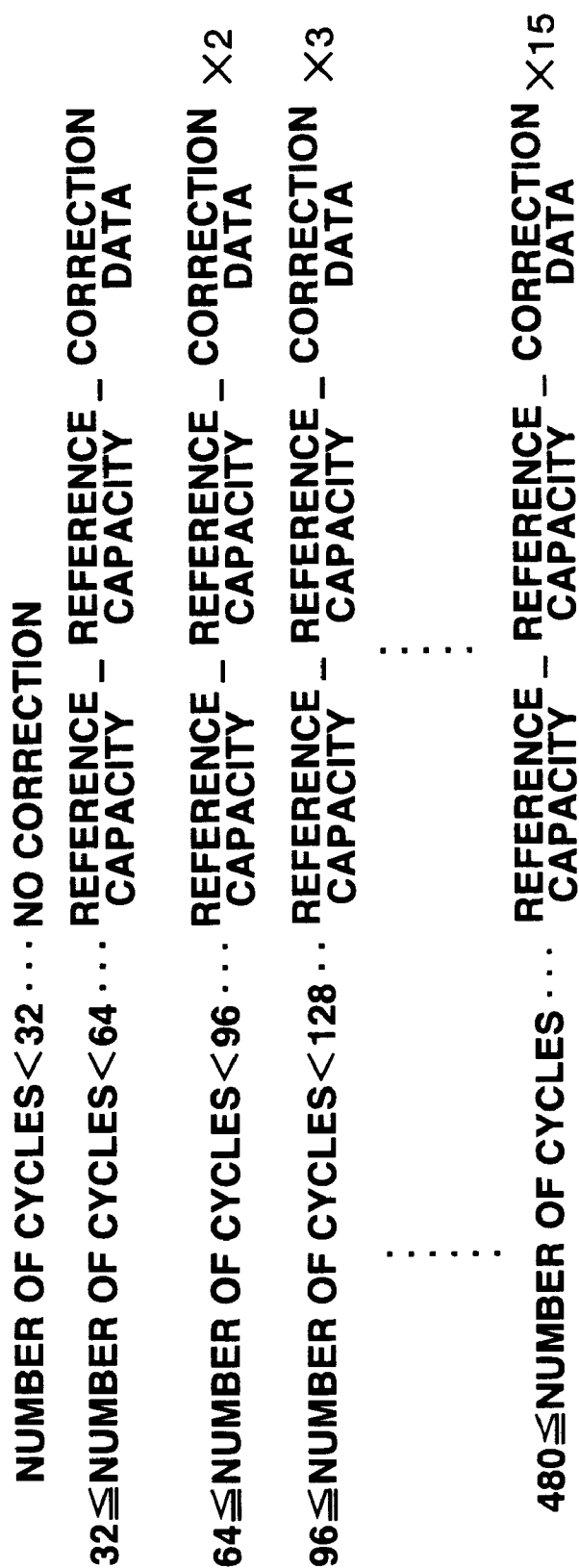
FIG. 12 illustrates another example of changes in the integrated residual battery capacity with respect to the number of cycles.

The 90% integrated residual value may also be stored in the ROM 177 every 32 cycles, as shown in FIG. 12. For example, the non-corrected 90% integrated residual value is stored as the reference capacity if the number of cycles is not less than 0 and not more than 32, the reference capacity less the correction data (constant value) is stored if the number of cycles is not less than 32 and not more than 64, the reference capacity less twice the correction data is stored if the number of cycles is not less than 48 and not more than 96 and the reference capacity less thrice the correction data is stored if the number of cycles is not less than 96 and not more than 128. That is, if the deteriorated capacity is linear, the 90% integrated residual value may be stored in accordance with this algorithm.

With the above-described battery pack and the number of counting the charging/discharging thereof, according to the present invention, in which the voltage is detected from the chargeable/dischargeable battery cell, plural battery levels are set and the number of times the detected voltage has transferred to different voltage levels is counted, the number of cycles can be counted correctly, even if the battery cell is deteriorated due to charging/discharging, depending on the degree of deterioration of the battery cell.

With the battery pack and the residual battery capacity setting method, according to the present invention, in which the integrated residual battery capacity on charging to a pre-set proportion relative to the full charging of the chargeable/dischargeable battery cell is stored in memory means at an interval of a pre-set number of cycles, the number of times the battery cell has been charged/discharged is counted and the stored integrated residual battery capacity for the pre-set number of cycles in the memory means corresponding to the number of counts by the counter is set as the residual battery capacity on full charging of the battery cell, the value of the integrated residual battery capacity on charging to the pre-set proportion corresponding to the number of cycles can be set. Since this enables the initial value on charging to be set in keeping with deterioration caused by charging/discharging of the battery cell, the residual battery capacity can be calculated more accurately than with the conventional battery pack.

Figure 13:
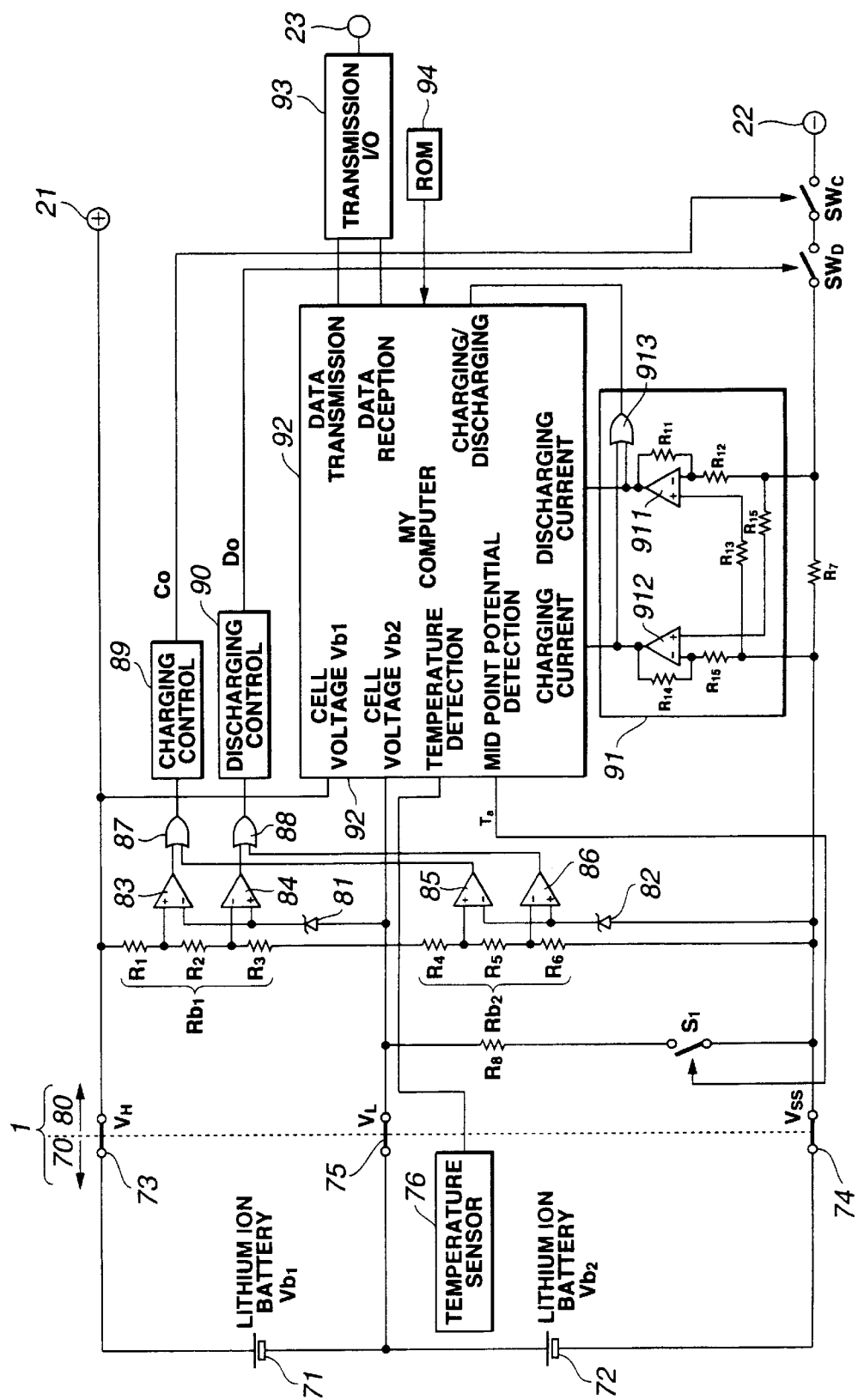
FIG. 13 shows a circuit structure of a battery pack.

FIG. 13 shows a specified circuit structure of the battery pack 1.

The battery pack 1 is made up of a battery cell block 70, having two battery cells, and a battery protection circuit block 80 for protecting the battery cell block 70 against overcharging or overdischarging.

The battery cell block 70 includes lithium ion batteries 71, 72, as two battery cells, connected in series with each other, and a temperature sensor 76 for detecting the temperature of the lithium ion batteries 71, 72. The positive electrodes and the negative electrodes of the lithium ion batteries 71, 72 are connected to a positive terminal 73 and to a negative terminal 74, respectively. The junction point of the lithium ion batteries 71, 72 is connected to a neutral point potential terminal 75. A temperature sensor 76 detects the temperature of the batteries 71, 72 to route the detected results to the battery protection circuit block 80.

The battery protection circuit block 80 includes a terminal VH, connected to the positive terminal 73, a terminal VSS, connected to the negative terminal 74, a terminal VL, connected to the neutral point potential terminal 75, resistors R1 to R6, for dividing the voltage across the respective terminals, a resistor RS and a first switch S1.

The terminals VH, VL are connected to each other through series connected resistors R1 to R3. The combined resistance of the series connected resistors R1 to R3 is the resistance Rb1 which may, for example, be 20 MΩ.

The terminals VL, VSS are connected to each other through series connected resistors R4 to R6. The terminals VL, VSS are connected to each other through the resistor RS and the first switch S1, connected in series with each other. Meanwhile, the combined resistance of the series-connected resistors R4 to R6 is Rb2 which may, for example, be 20 MΩ. That is, the resistance value of the resistor Rb1 is equal to that of the resistor Rb2. The resistance value of the resistor RS is 390 kΩ which is appreciably smaller than the combined resistance of the resistors Rb1 and Rb2. The first switch S1 is usually off and is turned on only during the time a neutral point potential confirming control signal Ts is furnished.

The battery protection circuit block 80 includes first and second Zener diodes 81, 82 for generating a reference voltage, first to fourth comparators 83 to 86 for detecting the potential difference between the respective resistors for detecting overcharging or overdischarging, a charging control circuit 89 for turning off a third switch $SW_C$ on overcharging and a discharging control circuit 90 for turning off a second switch $SW_D$ on overdischarging.

The first comparator 83 has its inverting input terminal connected to a cathode of the first Zener diode 81, while having its anode connected to the terminal VL. The first comparator 83 has its non-inverting input terminal connected to a junction point of the resistors R1, R2. The first comparator 83 detects whether or not the lithium ion battery 71 has been overcharged. The first comparator 83 outputs a logical H on detecting that the voltage Vb1 of the lithium ion battery 71 exceeds 4.25V, while outputting a logical L on detecting that the voltage Vb1 of the lithium ion battery 71 is less than 4.25V.

The second comparator 84 has its inverting input terminal connected to the cathode of the first Zener diode 81. The second comparator 84 has its non-inverting output terminal connected to a junction point between the resistors R2, and R3. The second comparator 84 detects whether the lithium ion battery 71 is in the overdischarging state. Thus, the second comparator 84 outputs a logical H if the voltage Vb1 of the lithium ion battery 71 is less than 2.45V, while outputting a logical L if the voltage Vb1 is larger than 2.45V.

The third comparator 85 has its inverting input terminal connected to a cathode of the second Zener diode 82, while having its anode connected to the terminal VSS. The third comparator 85 has its non-inverting output terminal connected to a junction point between the resistors R4 and R5. The third comparator 85 detects whether the lithium ion battery 72 is in the overcharging state. Thus, the third comparator 85 outputs a logical H on detecting that the voltage Vb2 of the lithium ion battery 72 exceeds 4.25V, while outputting a logical L if the voltage Vb2 is less than 4.25V.

The fourth comparator 86 has its inverting input terminal connected to the cathode of the second Zener diode 82. The fourth comparator 86 has its non-inverting input terminal connected to a junction point between the resistors R5 and R6. The fourth comparator 84 has its non-inverting output terminal connected to a junction point between the resistors R5 and R6. The fourth comparator 86 detects whether the lithium ion battery 72 is in the overdischarging state. Specifically, the fourth comparator 86 outputs a logical H if the voltage Vb2 of the lithium ion battery 72 is less than 2.45V, while outputting a logical L if the voltage Vb2 is larger than 2.45V.

A first OR gate 87 takes the logical sum of the outputs of the first and third comparators 83, 85 to route the results to the charging control circuit 89. An OR gate 88 takes the logical sum of the outputs of the second and fourth comparators 84, 86 to route the results to the discharging control circuit 90.

The charging control circuit 89 performs control to open and close the second switch SD if fed with the logical H or with the logical L from the first OR gate 87, respectively. The discharging control circuit 90 performs control to control to open and close the third switch SD if fed with the logical H or with the logical L from the second OR gate 88, respectively.

It is noted that the second and third switches $SW_D$, $SW_C$ are connected in series with each other. One of the second and third switches $SW_D$, $SW_C$ is connected to the second input/output terminal 22, while the other switch is connected through resistor R7 to the terminal VSS.

The battery-pack 1 also includes a charging/discharging current detection circuit 91 for detecting whether the battery pack is charging or discharging, a micro-computer 92 for controlling turning on/off of the first switch S1 and a communication interface 93 for data transmission/reception with outside.

The charging/discharging current detection circuit 91 includes first and second operational amplifiers 911, 912, and resistors Ring-like gasket 11 to R16.

The first operational amplifier 911 has its non-inverting input terminal connected via resistor R13 to the terminal VSS, while having its inverting output terminal connected through resistors R12 and R7 to the terminal VSS. A resistor R11 is connected across the inverting input terminal and the output terminal of the first operational amplifier 911. When the discharging current flows through the resistor R7, the first operational amplifier 911 outputs a voltage proportionate to the resistance ratio of resistor R12 to resistor R11 to the micro-computer 92 and to a third OR gate 913. If the charging current flows through the resistor R7, the second operational amplifier 912 outputs a voltage proportionate to the resistance ratio of resistor R15 to resistor R14 to the micro-computer 92 and to a third OR gate 913. The third OR gate 913 takes the logical sum to supply the result to the micro-computer 92. That is, the charging/discharging current detection circuit 91 detects the direction of the current flowing through the resistor R7 to detect whether charging/discharging is going on and, if the charging or discharging is detected, the charging/discharging current detection circuit 91 routes the result to the micro-computer 92 while also routing the values of the charging current or the discharging current to the micro-computer 92.

The micro-computer 92 is programmed to wake up and sleep if charging/discharging has been detected by the charging/discharging current detection circuit 91 or if data has been received over a communication interface 93, and if otherwise, respectively. The micro-computer 92 also is programmed to enter into a sleeping state if no charging/discharging current flows or there is made no data communication in two or three seconds after its actuation.

The micro-computer 92 perpetually detects the voltage of the terminal VL and also reads out optimum correction coefficients stored in the ROM 94, based on the temperature of the lithium ion batteries 71, 72 detected by the temperature sensor 76 to calculate the residual battery capacity of the lithium ion batteries 71, 72.

In the ROM 94 are stored not only the correction coefficients at an interval of 10° C., as discussed above in connection with FIG. 18, but also a control program for completing the correction coefficients or a control program for calculating the residual battery capacity.

The correction coefficients, at an interval of 10° C., stored in the ROM 94, are five correction coefficients, namely a correction coefficient 1 (=0.6) for 10° C. or lower, a correction coefficients 2 (=0.8) for 10 to 20° C., a correction coefficient 3 (=1.0) for 20 to 30° C., a correction coefficient 4 (=1.2) for 30 to 40° C. and a correction coefficient 5 (=1.4) for 40° C. or higher.

Figure 14:
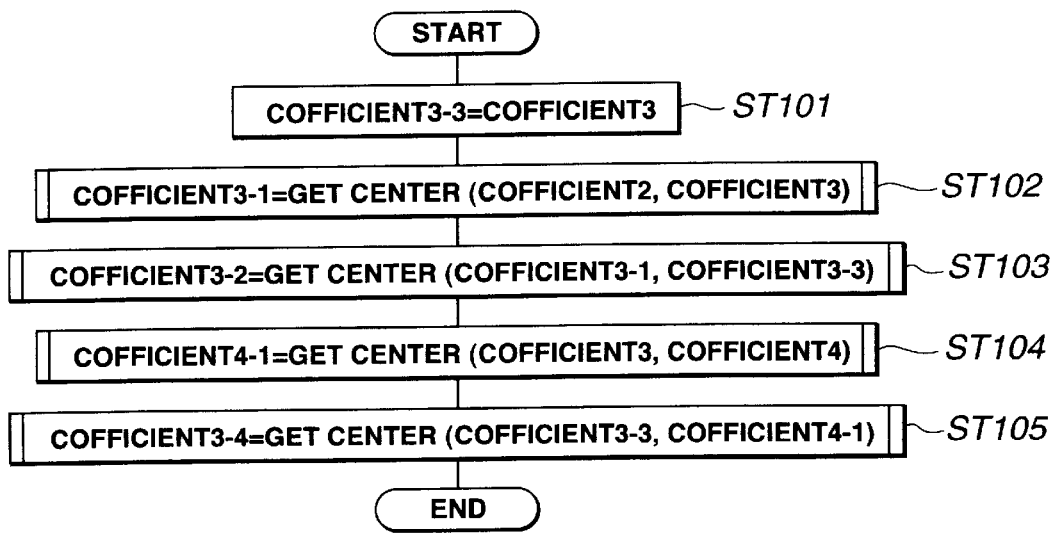
FIG. 14 is a flowchart for illustrating the main routine in calculating the correction coefficient.

For calculating more detailed correction coefficients, based on these correction coefficients the micro-computer 92 executes the processing as from step ST1 in the flowchart shown in FIG. 14. Here, the correction coefficient for 20 to 30° C. is taken as an example, the four correction coefficients are computed at an interval of 10° C.

At step ST101, the micro-computer 92 sets the correction coefficients stored in the ROM 94 as correction coefficient 3-3 for 25.0 to 27.5° C. That is, the correction coefficient 3-3 is set to 1.0. The micro-computer 92 then advances to step ST102.

At this step ST102, the micro-computer 92 calculates the correction coefficient 3-1 at 20.0 to 22.5° C. from the correction coefficients 2 and 3 stored in the ROM 94. The micro-computer 92 transfers to the subroutine processing shown in FIG. 15 to calculate the center of the two correction coefficients (step ST11). Specifically, the micro-computer 92 computes 0.9, as a median value of the correction coefficients 2, 3, to set the correction coefficient 3-1 to 0.9. The micro-computer then advances to step ST3.

Figure 15:
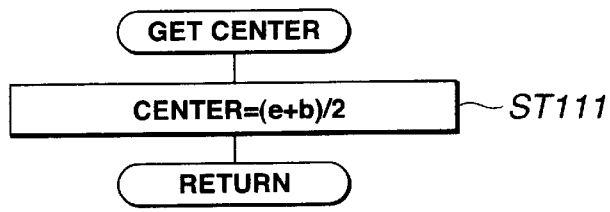
FIG. 15 is a flowchart for illustrating the subroutine in calculating the correction coefficient.

At step ST3, the micro-computer 92 executes the subroutine of step ST111 shown in FIG. 15 in order to compute the correction coefficient 3-2 for 22.5 to 25.0° C. from the correction coefficients 3-1 to 3-3. That is, the micro-computer 92 sets a median value 0.95 of the correction coefficient 3-1 (=0.9) and the correction coefficient 3-3 (=1.0) as the correction coefficient 3-2. The micro-computer 92 then advances to step ST104.

At this step ST104, the motion compensation 92 executes the subroutine of step ST111 of FIG. 15, in order to calculate the correction coefficient 4-1 for 30.0 to 32.5° C. from the correction coefficients 3 and 4 stored in the ROM 94. That is, the micro-computer 92 sets a median value 1.1 of the correction coefficients 3 and 4 as the correction coefficient 4-1. The micro-computer 92 then advances to step ST105.

At step ST105, the motion compensation 92 executes subroutine of step ST111 of FIG. 15, in order to calculate the correction coefficient 3-4 for 27.5 to 30.0° C. from the correction coefficients 3-3 and 4-1. That is, the micro-computer 92 sets a median value 1.05 of the correction coefficients 3-3 and 4-1 as the correction coefficient 3-4. The micro-computer 92 then terminates the processing.

Figure 16:
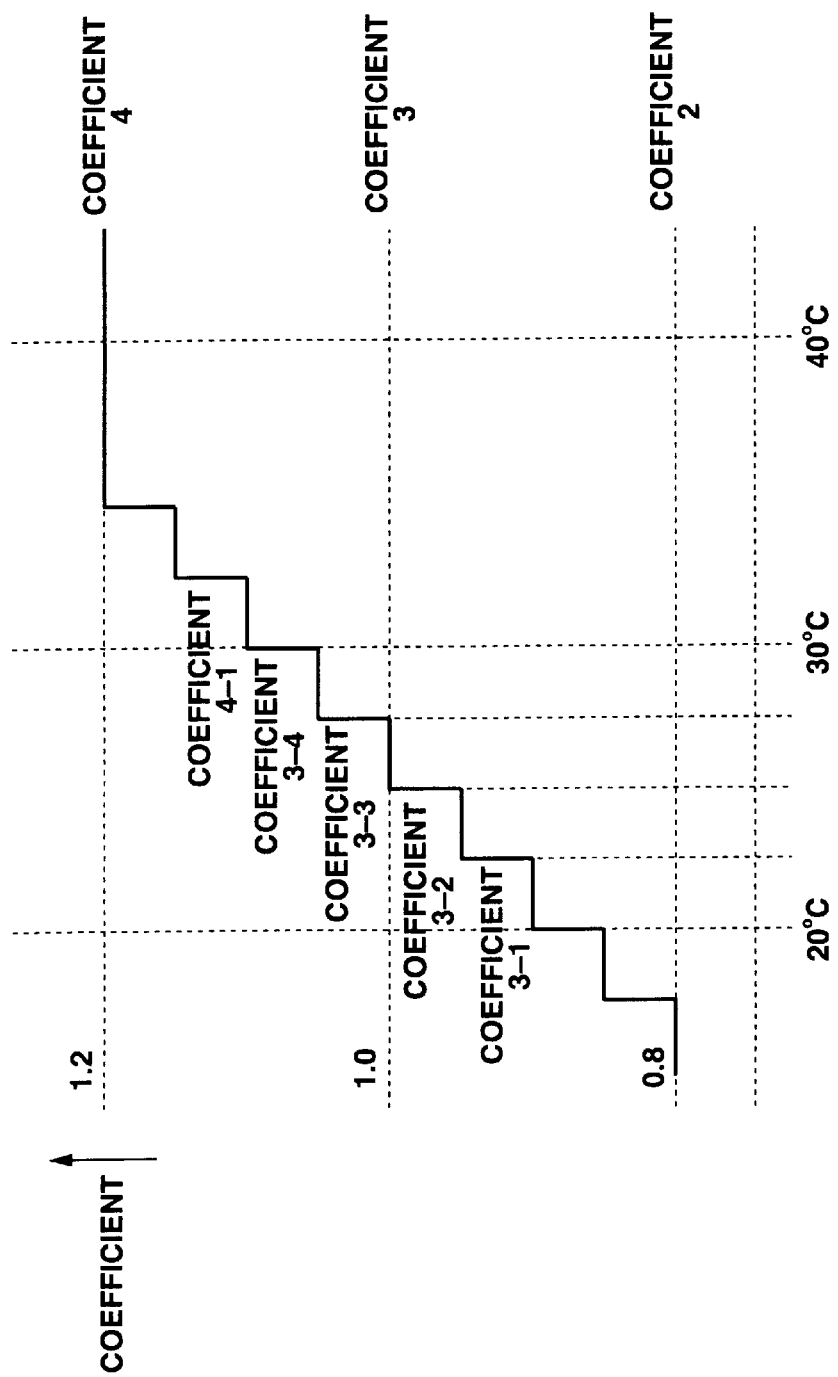
FIG. 16 illustrates the calculated results of the correction coefficient.

By the above processing, the micro-computer 92 acquires the correction coefficient 3-1 (=0.90) for the temperature of 20.0 to 22.5° C., the correction coefficient 3-2 (=0.95) for 22.5 to 25.0° C., the correction coefficient 3-3 (=1.0) for 27.5 to 30.0° C. and the correction coefficient 4-1 (=1.1) for 30.0 to 32.5° C., as shown in FIG. 16.

Figure 17:
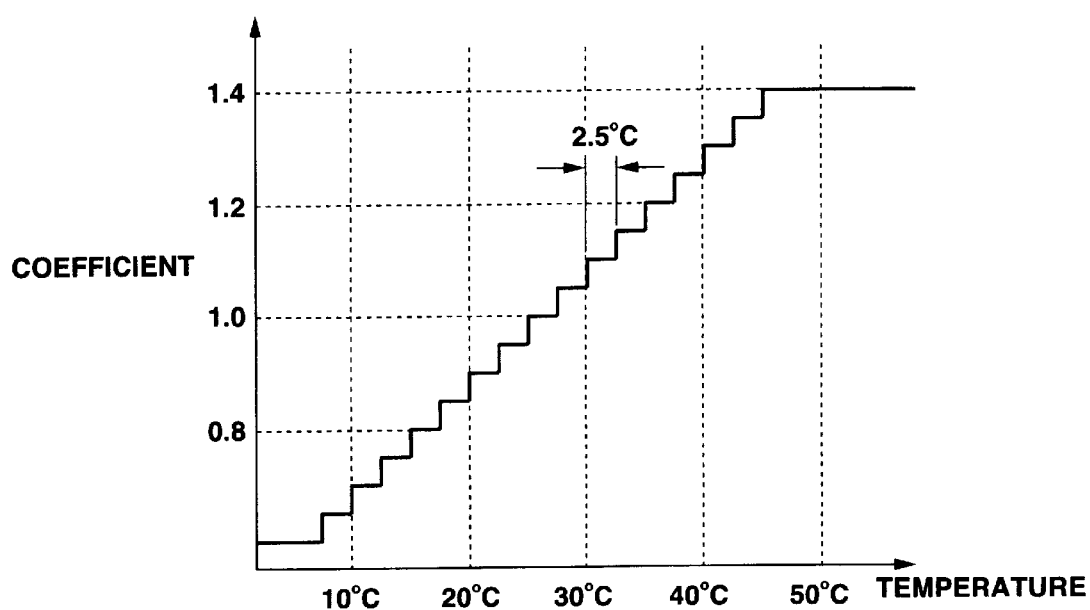
FIG. 17 illustrates the state of storage of the correction coefficients for each increment of 2.5° C. in a ROM.

The micro-computer 92 performs similar processing for the temperature range other than 20.0 to 30.0° C. to calculate the correction coefficient at an interval of 2.5° C., as shown in FIG. 17.

Since the micro-computer 92 is able to use these correction coefficients at small step width, it is able to compute the residual battery capacity accurately, based on the voltage at the terminal VL, even if the lithium ion batteries 71, 72 undergo temperature changes.

If the micro-computer 92 has computed the correction coefficients corresponding to the temperature detected by the temperature sensor 76 when it is performing the processing of steps ST101 ff., shown in FIG. 14, the micro-computer is able to interrupt the processing to use the correction coefficients to calculate the residual battery capacity.

For example, if the micro-computer 92 has detected the temperature of 26° C., the micro-computer 92 acquires the correction coefficient 3-3 (=1.0) for 25.0 to 27.5° at a time point it has performed the processing of step ST101. The micro-computer 92 can then halt the processing as from step ST102 to calculate the residual battery capacity.

Also, if the micro-computer 92 has detected 23° C., the micro-computer 92 is able to perform the processing of steps ST101 to ST103 to make accurate calculations of the residual battery capacity of the lithium ion batteries 71, 72 based on the correction coefficient 3-2 and the voltage at the terminal VL.

Meanwhile, the residual battery capacity can be calculated using a technique disclosed in Japanese Laying-Open Patent H-9-297166 without any particular limitations. It is however necessary that the technique used be such a one calculating the residual battery capacity using a temperature-dependent correction coefficient or the voltages of the lithium ion batteries 71, 72.

With the battery pack 1, in which only necessary minimum correction coefficients are stored in the ROM 94, and in which, if the temperature of the lithium ion batteries 71, 72 is detected, the correction coefficient is calculated only for the range of the detected temperature, correction coefficients can be calculated accurately depending on changes in temperature.

Also, in the processing of steps ST102 to ST105, the subroutine processing shown in FIG. 15 is performed repeatedly. Thus, the optimum correction coefficient can be computed easily without performing complex processing.

Figure 18:
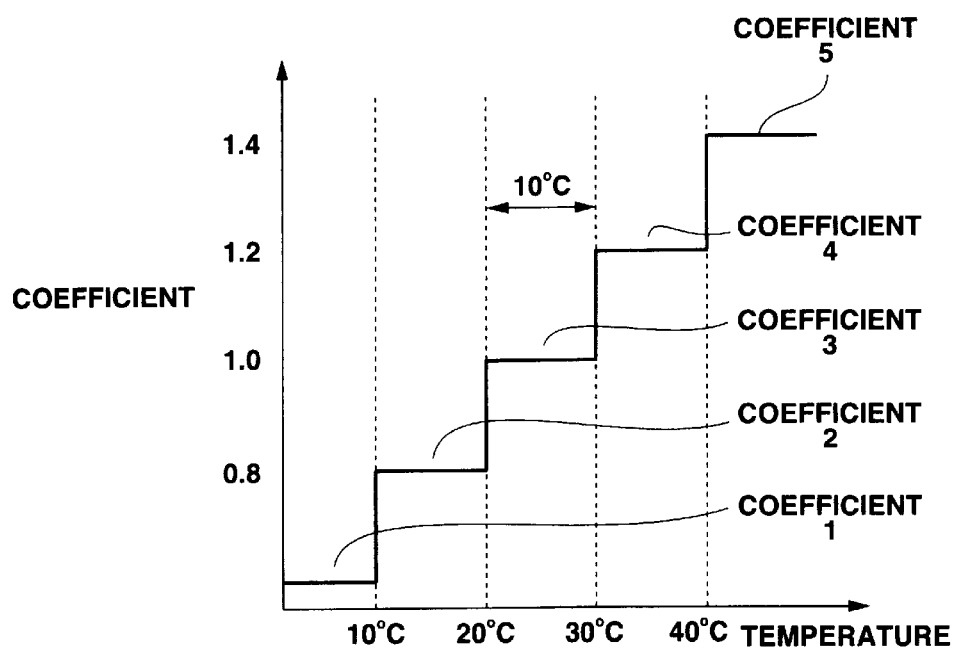
FIG. 18 illustrates step widths of correction coefficients in the related art.

In the present embodiment, explanation has been made on the assumption that the correction coefficients are stored at an interval of 10° C. as shown in FIG. 18. However, the correction coefficients may previously be stored at an interval of 2.5° C., as shown in FIG. 17. Also, in the present embodiment, explanation has been made on the assumption that the range of 10° C. is divided into four stages such that the correction coefficients are calculated at an interval of 2.5 (=10/4)° C. It is, however, possible to divide the temperature range at finer steps to compute more detailed correction coefficients.

If, with the battery pack and the residual battery capacity computing method, according to the present invention, a correction coefficient associated with a temperature detected by the temperature detection means is stored in the storage means, the correction coefficient is read out and the residual battery capacity is computed based on the correction coefficient and the voltage detected by the voltage detection means. If a correction coefficient associated with the detected temperature is not stored in the storage means, a correction coefficient associated with a pre-set temperature ahead and at back of the detected temperature is read out from the storage means to compute a correction coefficient associated with the detected temperature based on each read-out correction coefficient to compute the residual battery capacity based on the computed correction coefficient and the voltage detected by the voltage detection means. Thus, if there is produced a temperature change in the battery cell, a correction coefficient can be acquired correctly in keeping with such change to enable the residual battery capacity to be computed accurately at all times.

What is claimed is:

1. A battery pack, comprising:
   a chargeable/dischargeable battery cell operable to produce a voltage between a minimum voltage level and a maximum voltage level;
   voltage detection means for detecting said voltage of said battery cell during charging/discharging; and
   a counter including means for setting a plurality of battery voltage levels between said minimum voltage level and said maximum voltage level, said counter for counting a number of times that said voltage as detected by said voltage detection means passes through any two or more of said plurality of battery voltage levels during at least one of charging and discharging.

2. The battery pack according to claim 1, further comprising: verifying means for verifying that a service life of said battery cell has come to an end when a number of counts by said counter has exceeded a maximum number of charging/discharging counts.

3. The battery pack according to claim 1, wherein said counter counts a number of times that said voltage as detected by said voltage detection means at least one of (i) increases through each of said plurality of battery voltage levels, and (ii) decreases through each of said plurality of battery voltage levels.

4. A method for counting charging/discharging cycles of a battery pack, comprising:
   detecting a voltage produced by a chargeable/dischargeable battery cell;
   setting a plurality of battery voltage levels between a minimum voltage level and a maximum voltage level of said battery cell; and
   counting a number of times that said detected voltage passes through any two or more of said battery voltage levels during at least one of charging and discharging to obtain a count.

5. The method according to claim 4, wherein verification that a service life of said battery cell has come to an end is obtained when said count has exceeded a maximum number of counts.

6. The method according to claim 4, wherein said count is one of (i) increased when said detected voltage has passed through one of said battery voltage levels; and (ii) decreased when said detected voltage ha passed through one of said battery voltage levels.

7. A battery pack, comprising:
   a chargeable/dischargeable battery cell operable to produce a voltage between a minimum voltage level and a maximum voltage level;
   voltage detection means for detecting said voltage of said battery cell during charging/discharging; and
   storage means for storing a plurality of integrated residual battery capacity values representing magnitudes for charging to a pre-set proportion relative to full charging of said battery cell, each integrated residual battery capacity value corresponding to a pre-set number of charging/discharging cycles;
   a counter including means for counting a number of times that said voltage passes through at least one of a plurality of battery voltage levels during charging/discharging to obtain a count, said plurality of battery voltage levels being between a minimum voltage level and a maximum voltage level; and
   setting means for calculating a number of charging/discharging cycles from said count, and for setting an integrated residual battery capacity value for said battery cell by selecting one of said plurality of integrated residual battery capacity values stored in said storage means that corresponds to said charging/discharging cycles.

8. A method for setting a residual battery capacity of a battery pack, comprising:
   detecting a voltage produced by a battery cell;
   setting a plurality of battery voltage levels between a minimum voltage level and a maximum voltage level of said battery cell;
   counting a number of times that said detected voltage passes through at least one of said battery voltage levels during at least one of charging and discharging to obtain a count, said plurality of batter voltage levels being between said minimum voltage level and said maximum voltage level;
   calculating a number of charging/discharging cycles from said count; and
   setting an integrated residual battery capacity value for said battery cell by selecting one of a plurality of stored integrated residual battery capacity values that corresponds to said charging/discharging cycles, said plurality of integrated residual battery capacity values representing when a chargeable/dischargeable battery cell has been charged to a pre-set proportion relative to full charging of said chargeable/dischargeable battery cell.

9. A battery pack, comprising:
   at least one re-chargeable battery cell operable to produce a voltage between a minimum voltage level and a maximum voltage level;
   a voltage detector operable to measure said voltage;
   a processing unit operable to establish a plurality of voltage threshold levels between said minimum voltage level and said maximum voltage level and to compare said voltage against said voltage threshold levels; and
   a counter operable to advance a count as said voltage substantially reaches any two or more of said voltage threshold levels.

10. The battery pack of claim 9, wherein said counter advances said count at least one of: (i) only when said voltage falls substantially to each of said voltage threshold levels; (ii) only when said voltage rises substantially to each of said voltage threshold levels; and (iii) when said voltage rises or falls substantially to each of said voltage threshold levels.

11. The battery pack of claim 9, wherein said processing unit is further operable to compare said count against a maximum re-charging count, said comparison indicating that said at least one re-chargeable battery cell has substantially reached an end of service life when said count reaches said maximum re-charging count.

12. A battery pack, comprising:
   at least one re-chargeable battery cell operable to produce a voltage between a minimum voltage level and a maximum voltage level;
   a voltage detector operable to detect said voltage;
   a processing unit operable to establish a plurality of voltage threshold levels between said minimum voltage level and said maximum voltage level and to compare said voltage against said at least one voltage threshold level; and a counter operable to advance a count as said voltage substantially reaches any two or more of said voltage threshold levels, said processing unit being further operable to establish an integrated residual battery capacity for said at least one re-chargeable battery cell as a function of said count.

13. The battery pack of claim 12, wherein said processing unit is operable to reduce said integrated residual battery capacity as a function of said count.

14. The battery pack of claim 13, wherein said processing unit is operable to reduce said integrated residual battery capacity as a function of a predetermined advance in said count.

15. The battery pack of claim 12, further comprising a temperature detector operable to measure a temperature of said re-chargeable battery cell, wherein said processing unit is operable to (i) establish a correction coefficient based on said temperature, and (ii) establish said integrated residual battery capacity for said at least one re-chargeable battery cell as a function of said count and said correction coefficient.

16. The battery pack of claim 15, further comprising a memory operable to store a plurality of correction coefficients associated with corresponding temperatures, wherein said processing unit is operable to interpolate a correction coefficient when one of said stored plurality of correction coefficients does not correspond with said measured temperature.

17. The battery pack of claim 16, wherein said processing unit is operable to produce a plurality of interpolated correction coefficients based on, and falling between, two of said plurality of stored correction coefficients.

18. The battery pack of claim 17, wherein said processing unit is operable to produce a further plurality of interpolated correction coefficients based on, and falling between, two of said plurality of interpolated correction coefficients.

* * * * *

UNITED STATES PATENT AND TRADEMARK OFFICE
CERTIFICATE OF CORRECTION

PATENT NO. : 6,512,984 B1
DATED : January 28, 2003
INVENTOR(S) : Mamoru Suzuki and Hideyuki Sato It is certified that error appears in the above-identified patent and that said Letters Patent is hereby corrected as shown below:

Replace the title page with the attached.
Replace the specification with the attached.

<u>Column 15,</u>
Line 51, "ha" should read -- has --.

<u>Column 16,</u>
Line 21, "batter" should read -- battery --.

Signed and Sealed this

Twenty-third Day of November, 2004

JON W. DUDAS
*Director of the United States Patent and Trademark Office*

(12) United States Patent  (10) Patent No.: US 6,512,984 B1
Suzuki et al.  (45) Date of Patent: Jan. 28, 2003

(54) BATTERY PACK, METHOD FOR CHARGING/DISCHARGING COUNTING AND METHOD FOR SETTING RESIDUAL CAPACITY OF THE BATTERY PACK

(75) Inventors: Mamoru Suzuki, Kanagawa (JP); Hideyuki Sato, Chiba (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/517,886

(22) Filed: Mar. 3, 2000

(30) Foreign Application Priority Data

Mar. 5, 1999 (JP) ............................ P11-059356
Mar. 5, 1999 (JP) ............................ P11-059358

(51) Int. Cl.$^7$ ............................................ G06F 19/00
(52) U.S. Cl. ........................ 702/63; 346/636; 346/637
(58) Field of Search ............................ 702/63; 340/636, 340/637

(56) References Cited

U.S. PATENT DOCUMENTS

| | | | |
|---|---|---|---|
| 4,031,450 A | * | 6/1977 | Hammel et al. ............. 320/23 |
| 4,377,787 A | * | 3/1983 | Kikuoka et al. ............. 324/431 |
| 4,803,416 A | * | 2/1989 | Abiven et al. ............. 320/44 |
| 5,592,094 A | | 1/1997 | Ichikawa |
| 5,648,717 A | | 7/1997 | Uskali ............. 320/43 |
| 5,661,463 A | | 8/1997 | Letchak et al. |
| 5,675,258 A | | 10/1997 | Kadouchi et al. |
| 5,798,702 A | | 8/1998 | Okamoto et al. |
| 5,872,453 A | | 2/1999 | Shimoyama et al. |

FOREIGN PATENT DOCUMENTS

| JP | 09 243718 | 9/1997 |
|---|---|---|
| JP | 09-243718 A | 9/1997 |
| WO | WO 97/27659 | 7/1997 |

* cited by examiner

*Primary Examiner*—John S. Hilten
*Assistant Examiner*—Stephen J. Cherry
(74) *Attorney, Agent, or Firm*—Lerner, David, Littenberg, Krumholz & Mentlik, LLP

(57) ABSTRACT

A battery pack, comprising at least one re-chargeable battery cell operable to produce a voltage between a minimum voltage level and a maximum voltage level; a voltage detector operable to measure said voltage; a processing unit operable to establish a plurality of voltage threshold levels between said minimum voltage level and said maximum voltage level and to compare said voltage against said voltage threshold levels; and a counter operable to advance a count as said voltage substantially reaches at least one of said voltage threshold levels.

18 Claims, 15 Drawing Sheets

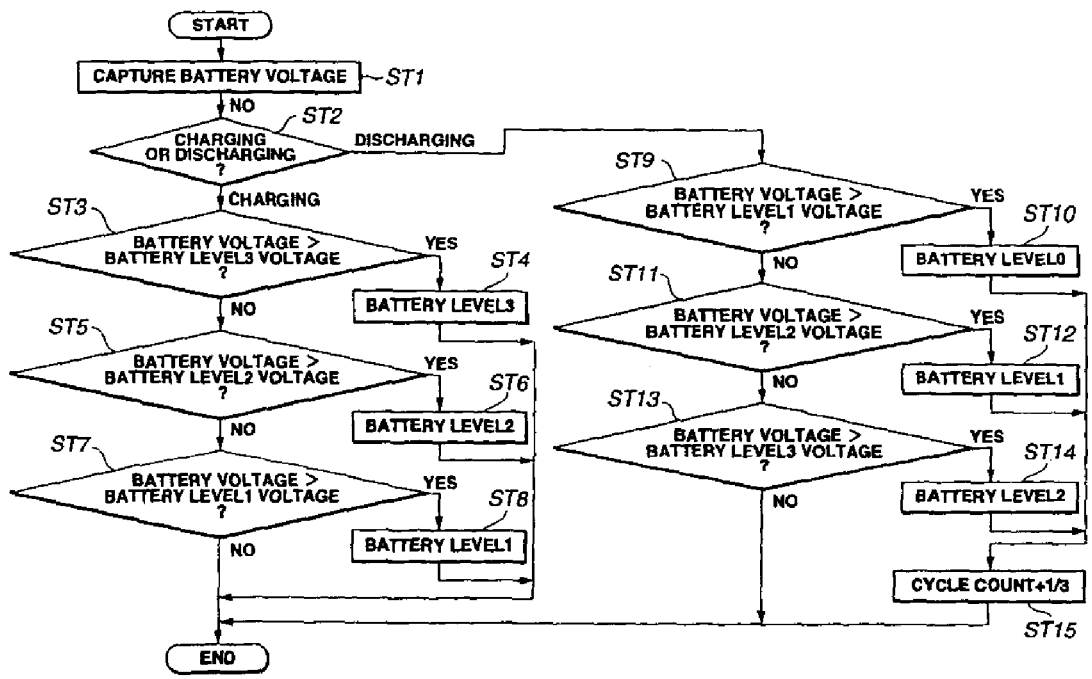

BATTERY PACK, METHOD FOR CHARGING/DISCHARGING COUNTING AND METHOD FOR SETTING RESIDUAL CAPACITY OF THE BATTERY PACK

BACKGROUND OF THE INVENTION

This invention relates to a battery pack, a method for charging/discharging counting and a method for setting the residual capacity of the battery pack.

Up to now, there has been furnished a battery pack having battery cells as secondary batteries, such as lithium ion cells, NiCd cells or nickel hydrogen cells.

The battery pack usually includes a micro-computer for performing calculations of the residual battery capacity of the battery cells or communication with electronic equipment having the battery cell as a power source, peripherals of the micro-computer and a battery cell status detection circuit necessary in carrying out calculations of the residual battery capacity.

The number of charging/discharging cycles of the battery pack is not infinite. On the other hand, the maximum number of charging/discharging cycles, capable of maintaining practically tolerable charging/discharging characteristics, is determined to some extent depending on the type of the battery cell.

In the conventional battery pack, it has been difficult for the user to recognize the maximum number of charging/discharging cycles, capable of maintaining practically tolerable charging/discharging characteristics, that is the service life of the battery cell. The user is only able to recognize the approaching end of service life of the battery cell, as the charging/discharging is repeated, on recognizing that battery capacity is decreasing at a faster rate even though the cell has been charged to its full capacity.

In order to permit the user to recognize the service life of the battery cell easily, the present Applicant has proposed in Japanese Laying-Open Patent H-9-243718 a battery pack and a method for displaying the state of the battery, referred to below as the first disclosed technique.

The first disclosed technique, shown in FIG. 1, detects that the voltage of the battery cell has exceeded the first threshold voltage, and further detects that the voltage has become lower than a second threshold voltage. The first disclosed technique counts the number of charging/discharging cycles on the assumption that one cycle of charging or discharging occurs when one of the voltage states is detected after detecting the other voltage state.

On the other hand, in a battery pack having plural battery cells, the maximum charging voltage differs from one battery cell to another. Thus, the present Assignee proposed in Japanese Laying-Open Patent H-9-285026 a battery charging method and apparatus and a battery pack, referred to below as the second disclosed technique.

In the second disclosed technique, the residual battery capacity is computed based on the charging of the battery cell and the initial value (e.g., voltage) stored in the battery cell.

The battery pack is loaded on an electronic equipment, such as a video camera device, to furnish the current to the equipment. If the power source has become depleted, the battery pack is charged. This battery pack has a battery cell, as a chargeable and dischargeable secondary battery, and a micro-computer for detecting the voltage of the battery cell to compute the residual battery capacity.

Since the residual battery capacity is varied appreciably with temperature, it is computed using a temperature dependent coefficient of the battery cell, as stated for example in Japanese Laying-Open Patent H-9-297166. This temperature dependent residual capacity correction coefficient is referred to below as the correction coefficient. Since this correction coefficient differs in magnitude with temperature, the correction coefficient for each increment of 10° C. is stored in a non-volatile memory, such as ROM. The micro-computer computes the residual battery capacity using the correction coefficient stored in the non-volatile memory and which corresponds to the current temperature.

However, in the first disclosed technique, count-up is made only when the battery cell voltage falls below the second threshold value, such that, if the battery cell is charged before the cell voltage falls below the second threshold value, count-up is not made. Thus, there is raised a problem that, even though the battery cell is deteriorated due to charging/discharging, the cycle is not counted correspondingly. Although it may be attempted to set the second threshold to a higher value, count-up then occurs while as yet there is left sufficient battery power, such that count-up cannot be made correctly.

On the other hand, the conventional battery pack is designed so that, once the charging is made up to 90%, this 90% charging is deemed to be full charging, in order to absorb errors in current detection etc in charging. Thus, in the battery pack, the integrated value of the residual battery capacity on 90% charging is previously stored in the ROM and, if it is verified that charging up to 90% has been made, the battery capacity is set as the integrated residual battery capacity value.

However, if the charging/discharging is repeated, the battery cell is deteriorated, such that the battery capacity that can be retrieved actually is decreased. With this battery cell deterioration, the integrated residual battery capacity on 90% charging is lowered, thus producing a gap between the integrated residual battery capacity on 90% charging stored in the non-volatile memory and the actual integrated residual battery capacity.

If the residual battery capacity is computed based on the initial value stored in the battery cell at the time of charging, in accordance with the second disclosed technique, there is presented a problem that the residual battery capacity cannot be computed correctly.

SUMMARY OF THE INVENTION

It is therefore an object of the present invention to provide a battery pack in which, if a battery cell is deteriorated due to charging/discharging, the number of cycles is counted depending on the deterioration, and in which the residual battery capacity can be accurately set depending on the deterioration.

It is another object of the present invention to provide a method for counting the number of charging/discharging cycles in the battery pack, and a method for setting the residual battery capacity of the battery pack.

In one aspect, the present invention provides a battery pack including voltage detection means for detecting the voltage of a battery cell, storage means for storing a correction coefficient for calculating the residual battery capacity for a pre-set temperature, temperature detection means for detecting the temperature of the battery cell and computing means. This computing means operates so that, if a correction coefficient associated with a temperature detected by the temperature detection means is stored in the storage means, the computer means reads out the correction coefficient to compute the residual battery capacity based on the correction coefficient and the voltage detected by the voltage detection means. The computing means also operates so that, if a correction coefficient associated with a temperature detected by the temperature detection means is not stored in the storage means, the computer means reads out a correction coefficient associated with a pre-set temperature ahead and at back of the detected temperature from the storage means to compute a correction coefficient associated with the detected temperature based on each read-out correction coefficient to compute the residual battery capacity based on the computed correction coefficient and the voltage detected by the voltage detection means.

In another aspect, the present invention provides a method for computing the residual battery capacity of a battery pack associated with a pre-set temperature including storing a correction coefficient for calculating the residual battery capacity for a pre-set temperature, and detecting the temperature of the battery cell, wherein, if a correction coefficient associated with a temperature detected by the temperature detection means is stored in the storage means, the correction coefficient is read out and the residual battery capacity is computed based on the correction coefficient and the voltage detected by the voltage detection means. Also, if a correction coefficient associated with the detected temperature is not stored in the storage means, a correction coefficient associated with a pre-set temperature ahead and at back of the detected temperature is read out from the storage means to compute a correction coefficient associated with the detected temperature based on each read-out correction coefficient to compute the residual battery capacity based on the computed correction coefficient and the voltage detected by the voltage detection means.

BRIEF DESCRIPTION OF THE DRAWINGS

FIG. 1 illustrates the manner of counting the number of cycles in the related art.

Figure 2:
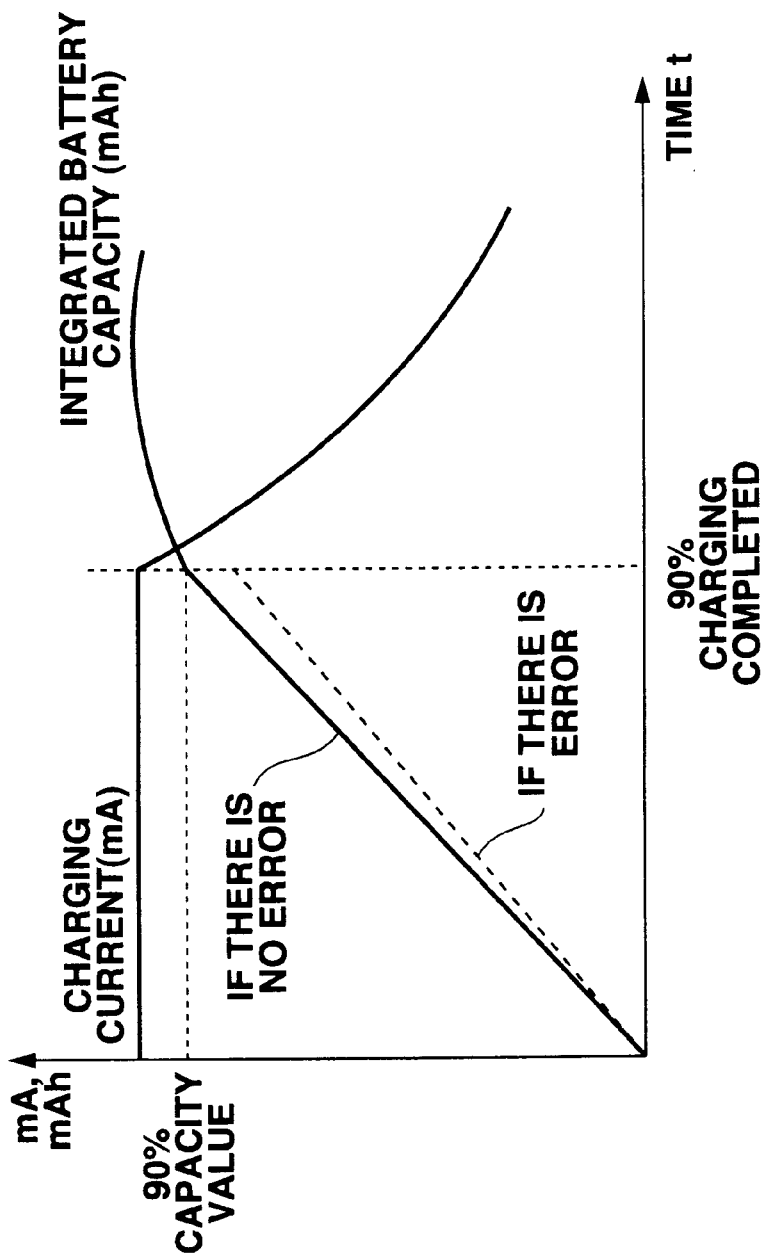
FIG. 2 is a graph showing changes in linear characteristics of the integrated residual battery capacity in case the battery cell is deteriorated.

FIG. 2 is a graph showing changes in linear characteristics of the integrated residual battery capacity in case the battery cell is deteriorated.

FIG. 3 illustrates the state of loading a battery pack embodying the present invention on a video camera device.

FIG. 4 is a perspective view of a battery pack.

FIG. 5 is a perspective view showing the back side of the battery pack.

FIG. 6 is a perspective view of a battery loading unit provided in the video camera device.

FIG. 7 illustrates the circuit structure of the battery pack.

Figure 8:
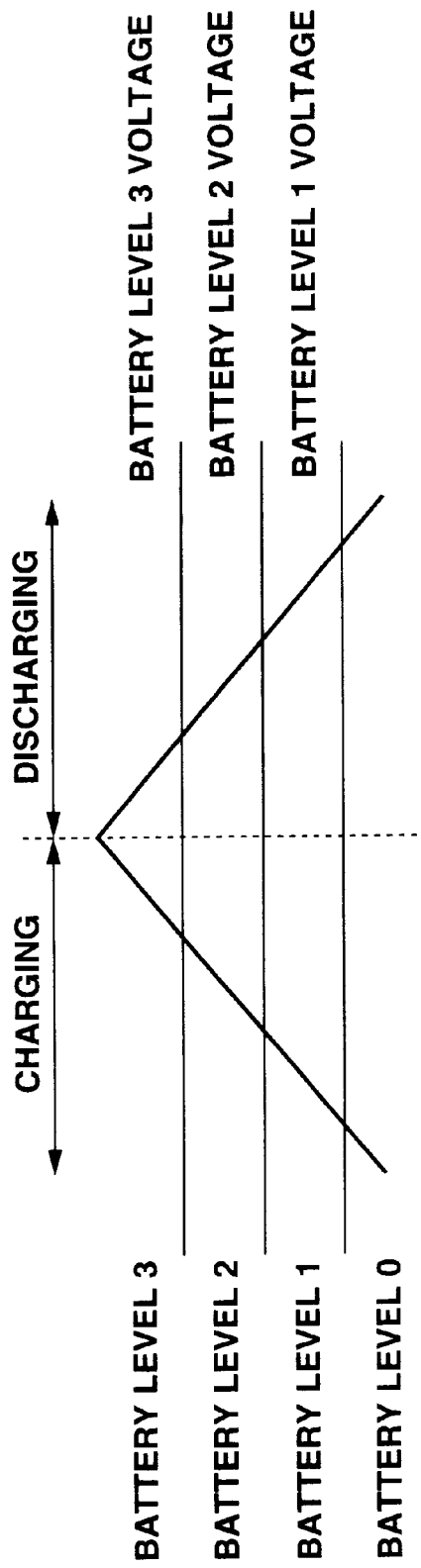
FIG. 8 illustrates the relation between the voltage level and the battery level.

FIG. 8 illustrates the relation between the voltage level and the battery voltage level.

FIG. 9 is a flowchart for illustrating the operating contents of the battery voltage level setting and the cycle counting.

FIG. 10 illustrates the counting of the number of cycles.

FIG. 11 illustrates an example of changes in the integrated residual battery capacity with respect to the number of cycles.

FIG. 12 illustrates another example of changes in the integrated residual battery capacity with respect to the number of cycles.

FIG. 13 shows a circuit structure of a battery pack.

FIG. 14 is a flowchart for illustrating the main routine in calculating the correction coefficient.

FIG. 15 is a flowchart for illustrating the subroutine in calculating the correction coefficient.

FIG. 16 illustrates the calculated results of the correction coefficient.

FIG. 17 illustrates the state of storage of the correction coefficients for each increment of 2.5° C. in a ROM.

FIG. 18 illustrates step widths of correction coefficients in the related art.

DESCRIPTION OF THE PREFERRED EMBODIMENTS

Referring to the drawings, preferred embodiments of the present invention will be explained in detail.

The present invention is applicable to, for example, a battery pack 1 shown in FIG. 3. This battery pack 1 is loaded on a battery loading unit 3 of, for example, a video camera device 2, to supply the power to the video camera device 2. On the other hand, the battery pack 1 can be loaded on a charging device, not shown, for charging.

The battery pack 1 includes a casing 19, as shown in FIG. 4. The casing 19 accommodates therein a battery cell, not shown.

The casing 19 of the battery pack 1 is formed of, for example, a synthetic resin material. In both width-wise lateral sides of the casing 19 are formed guide grooves 26, 26 for guiding the loading relative to the battery loading unit 3. The guide grooves 26, 26 in the respective lateral sides are opened at ends thereof in a bottom surface 24 (FIG. 5) of the casing 19 and are formed side-by-side along the length of the casing 19.

On both width-wise lateral sides of the casing 19 on a front surface 20 along the loading direction relative to the battery loading unit 3, there are provided a first input/output terminal 21 and a second input/output terminal 22. At a mid portion along the width-wise direction, there is provided a communication terminal 23.

The first and second input/output terminals 21, 22 furnish the power to a main body portion of the video camera device 1 through the battery loading unit 3. The communication terminal 23 outputs information signals, such as residual power of the battery cell, to the main body portion of the video camera device 1. The ends of the input/output terminals 21, 22 and the communication terminal 23 facing outwards are positioned in substantially rectangular recesses formed in the front surface 20 of the casing 19 and thereby prevented from being destroyed due to abutting contact on other portions of the battery loading device other than the connection terminals.

In the front side of the bottom surface 24 of the casing 19, that is in the front surface along the lengthwise direction, there are formed a pair of control recesses 28, 29. These control recesses 28, 29 are formed line-symmetrically with respect to a mid line, not shown, in the width-wise direction, as shown in FIG. 3. In loading, these control recesses 28, 29 are engaged by control projections, not shown, of the battery loading unit 3, to limit the tilt in the width-wise direction of the bottom surface 24 of the casing 19 relative to the battery loading unit 3.

These control recesses 28, 29 are each substantially of an L-shape made up of a first portion perpendicular to the bottom surface 24 of the casing 19 and a second portion perpendicular to this first portion, as shown in FIG. 5.

In a mid portion of the bottom surface 24 of the casing 19 is formed a substantially rectangular discriminating recess 30 for discriminating whether or not the battery loading unit is an appropriate unit.

The discriminating recess 30 is positioned at a position on a mid line in the width-wise direction of the casing 19 lying closer to the front surface 20 from the mid point of the bottom surface 24 of the casing 19. In the bottom surface within the discriminating recess 30 is formed a substantially rectangular discriminating groove 32 in continuation to both longitudinal ends of the recess 30 substantially on the centerline along the width-wise direction of the casing 19. On both sides in the width-wise direction of the bottom surface 24 of the casing 19, there are formed steps in the discriminating recess 30. The discriminating recess 30 has a width-wise size of $W_0$.

Adjacent to the communication terminal 23 is formed a first guide groove 34 extending parallel to the longitudinal direction of the casing 19. This first guide groove 34 has its one end opened in the front surface 20 of the casing 19, while having its other end formed in continuation to the discriminating recess 30. Adjacent to the front surface 20 of the casing 19 is formed in the first guide groove 34 a step 35 different in depth in the depth-wise direction corresponding to the direction perpendicular to the bottom surface 24 of the casing 19. This first guide groove 34 guides the battery pack loading direction relative to the battery loading unit 3.

In the bottom surface 24 of the casing 19 is formed a second guide groove 36 facing the first guide groove 34 with the communication terminal 23 in-between. This second guide groove 36 is formed parallel to the longitudinal direction of the bottom surface 24 of the casing 19 so that its one end is opened in the front surface 20 of the casing 19.

In both lateral sides in the width-wise direction of the casing 19 are formed control grooves 37, 37 adjacent to the first and second input/output terminals 21, 22. The control grooves 37, 37 are opened in the front surface 20, while extending substantially parallel to the bottom surface 24 of the casing 19, for limiting the tilt in the width-wise direction of the bottom surface 24 relative to the battery loading unit 3.

In the bottom surface 24 of the casing 19 are formed a first lock recess 38 and a second lock recess 39 engaged by the battery loading unit 3 on loading the battery pack on the battery loading unit 3. The first lock recess 38 is substantially rectangular in profile and is positioned neighboring to the discriminating recess 30 on a width-wise mid line of the casing 19. The second lock recess 39 is substantially rectangular in profile and is slightly larger in size than the first lock recess 38. The second lock recess 39 is formed close to the back side looking along the loading direction on a width-wise mid line of the casing 19.

On the other hand, the battery loading unit 3 (FIG. 6) provided on the camera device 2 is slightly larger in size than the bottom surface 24 of the casing 19. The battery loading unit 3 is provided on both lateral sides facing both widthwise lateral sides of the battery pack 1 with a pair of guide projections 47 engaging in the guide grooves 26, 26 of the battery pack 1.

When loading the battery pack on the battery loading unit 3, the guide projections 47 extend into the guide grooves 26, 26 of the casing 19 to guide the extension direction and to hold the battery pack 1 with the bottom surface 24 of the casing 19 substantially parallel to a setting surface 45.

On the side of an abutting surface 46 of the battery loading unit 3 facing the front surface 20 of the battery pack 1 is formed a terminal portion 44. This terminal portion 44 is made up of first to third connection terminals 51 to 53 and a cover member 60.

The first and second connection terminals 51, 52 are provided on both sides along the width of the battery loading unit 3 for connection to the first and second input/output terminals 21, 22, respectively. The third connection terminal 53 is positioned at a mid point in the width-wise direction of the battery loading unit 3 for connection to the communication terminal 23 of the battery pack 1. The first to third connection terminals 51 to 53 are provided on the abutting surface 46 of the battery loading unit 3 parallel to the bottom surface 24 and to the longitudinal of the battery pack 1.

The cover member 60 is mounted on the battery loading unit 3 for rotation in the direction indicated by arrows a1, a2 to protect the first to third connection terminals 51 to 53 from outside.

The cover member 60 is formed of, for example, a synthetic resin material, and is made up of a substantially rectangular protection piece 61 and supporting pieces 62, 62 for supporting the protection piece 61. The surface of the protection piece 61 of the cover member 60 facing the setting surface 45 of the battery loading unit 3 is formed with a surface inclined with respect to the thickness direction. When the battery pack 1 is loaded on the battery loading unit 3, the casing 19 compresses against the protection piece 61 to permit the cover member 60 to be rotated easily in the direction indicated by arrow a2. The supporting pieces 62, 62 of the cover member 60 are supported by the abutting surface 46 of the battery loading unit 3 for rotation about a pivot shaft, not shown. A torsion coil spring, not shown, is provided on the outer periphery of the pivot shaft of the cover member 60. This torsion coil spring has its one end retained by the abutting surface 46 of the battery loading unit 3, while having its other end retained by the supporting pieces 62, 62 of the cover member 60. Thus, the cover member 60 is biased in the direction indicated by arrow a1 under the elasticity of the torsion coil spring to overlie the first to third connection terminals 51 to 53.

The battery loading unit 3 is formed with a pair of control projections 65, 66 astride the abutting surface 46 and the setting surface 45, substantially line-symmetrically with respect to the centerline, so as to be engaged in the control recesses 28, 29 of the battery pack 1.

These control projections 65, 66 are each substantially of an L-shape made up of a first portion perpendicular to the setting surface 45 and a second portion perpendicular to this first portion. These control projections 65, 66 restrict the bottom surface 24 of the battery pack 1 from being tilted in the width-wise direction with respect to the setting surface 45 of the battery loading unit 3.

The battery loading unit 3 is also formed with a first guide projection 68, near the third connection terminal 53, astride the abutting surface 46 and the setting surface 45, for guiding the insertion of the battery pack 1. This first guide projection 68 is formed parallel to the longitudinal direction of the setting surface 45 for engaging in the first guide groove 34 of the bottom surface 24 of the battery pack 1 being loaded, as shown in FIG. 4.

The battery loading unit 3 is also formed with a second guide projection 54, astride the abutting surface 46 and the setting surface 45, for guiding the loading direction of the battery pack 1. The second guide projection 54 is formed as one with the setting surface 45 parallel to its longitudinal direction. This second guide projection 54 is engaged in the second guide groove 36 of the battery pack 1 to guide the loading direction.

Both lateral sides along the width of the battery loading unit 3 are formed as one with control pawls 55, 55 engaged in the control grooves 37, 37. The control pawls 55, 55 are parallel to the setting surface 45 and to the longitudinal direction of the battery pack 1.

At a mid portion of the setting surface 45 of the battery loading unit 3, there is formed a discriminating projection 56 engaged in the discriminating recess 30 of the battery pack 1. This discriminating projection 56 is substantially rectangular in profile. The distal end of the discriminating projection 56 is formed as one with a discriminating lug 56 engaged in the discriminating groove 32 of the battery pack 1. This discriminating projection 56 has a width $W_1$ parallel to the width of the setting surface 45 smaller than the width $W_0$ of the discriminating recess 30 of the battery pack 1, so that the discriminating projection 56 can be inserted into the discriminating recess 30, as shown in FIG. 6. The discriminating projection 56 is formed at a position spaced a distance L1 from the abutting surface 46 in the vertical direction.

With the above-described structure of the battery loading unit 3, the battery pack 1 can be loaded on the battery loading unit 3.

The charging device for charging the battery pack 1 is also provided with a battery loading unit constructed similarly to the battery loading unit 3.

The circuit structure of the battery pack 1 is hereinafter explained.

Referring to FIG. 7, the battery pack 1 is provided with lithium ion batteries 171, 172, as two serially connected battery cells, a first input/output terminal 121 connected to the positive terminal of the lithium ion battery 171 through a resistor R103 and a second input/output terminal 122 connected to the negative electrode of the lithium ion battery 172.

The lithium ion batteries 171, 172 are charged or discharged through the first and second input/output terminals 121, 122. The lithium ion batteries 171, 172 are connected in parallel with serially connected resistors R101, R102. That is, the positive electrode of the lithium ion battery 171 is connected to the resistor R101, while the negative electrode of the lithium ion battery 172 is connected to the resistor R102.

The battery pack 1 is also provided with a current detection circuit 173 for detecting the current flowing through the resistor R103, an A/D converter 174 for digitizing the charging/discharging current value and the battery voltage value and a central processing unit (CPU) 175 for counting the number of charging/discharging cycles, referred to below as the number of cycles, and calculating the residual battery capacity. The battery pack 1 also includes a random access memory (RAM) 176 for transiently storing the current and voltage levels of the lithium ion batteries 171, 172 and a read-only memory (ROM) 177 having stored therein the control program for the CPU 175.

The current detection circuit 173 detects the current flowing in the resistor R103 during charging or discharging to route the detected current to an A/D converter 174.

The A/D converter 174 digitizes the current value from the current detection circuit 173 to route the digitized current to the CPU 175. The A/D converter 174 digitizes the voltage value of a connection terminal of resistors R101, R102, referred to below as a mid point connection terminal, that is the divided voltage value R102/(R101+R102) of the terminal voltage of the series connected lithium ion batteries 171, 172, to route the digitized voltage to the CPU 175.

The CPU 175 is provided with a counter 175a for counting the number of cycles. The CPU 175 divides the voltage level of the mid point connection terminal X into four stages of the battery voltage level 0 to the battery voltage level 3 (FIG. 8), with the highest battery voltage level being a battery voltage level 3 and with the lowest battery voltage level being a battery voltage level 0. The CPU 175 counts up one using counter 175a each time the battery voltage level is decremented by one.

Specifically, the CPU 175 sets the battery voltage level in accordance with the flowchart shown in FIG. 9 to count the number of cycles.

When the current detection circuit 173 detects the charging current of the discharging current, the CPU 175 moves to step ST1 to capture the battery voltage at the mid point connection terminal X through the A/D converter 174. The CPU then advances to step ST2.

At step ST2, the CPU 175 verifies whether charging is going on or discharging is going on, based on a detection output of the current detection circuit 173. If the CPU 175 verifies that the charging is going on, the CPU advances to step ST3. If the CPU 175 verifies that the discharging is going on, the CPU advances to step ST9.

At step ST3, the CPU 175 checks whether or not the voltage level at the mid point connection terminal X is higher than the battery voltage level 3. If the result is YES, the CPU 175 advances to step ST4 and, if otherwise, to step ST5.

At step ST4, the CPU 175 assumes the current voltage level to be the battery voltage level 3 to write the level in the RAM 176 to terminate the processing.

At step ST5, the CPU 175 checks whether or not the voltage level at the mid point connection terminal X is higher than the battery voltage level 2. If the result is YES, the CPU 175 advances to step ST6 and, if otherwise, to step ST7.

At step ST6, the CPU 175 assumes the current voltage level to be the battery voltage level 2 to write the level in the RAM 176 to terminate the processing.

At step ST7, the CPU 175 checks whether or not the voltage level at the mid point connection terminal X is higher than the battery voltage level 1. If the result is YES, the CPU 175 advances to step ST8 and, if otherwise, the CPU 175 assumes the current voltage level to be the battery voltage level 0 and writes the level in the RAM 176 to terminate the processing.

At step ST8, the CPU 175 assumes the current voltage level to be the battery voltage level 1 to terminate the processing.

At step ST9, to which the CPU 175 advances when it is verified that discharging is going on at step ST2, the CPU 175 verifies whether or not the voltage level at the mid point connection terminal X is lower than the battery voltage level 1, that is whether or not the battery voltage level has transferred from 1 to 0. If the result of this check is YES, the CPU advances to step ST10 and, if otherwise, to step ST11.

At step ST10, the CPU 175 assumes that the current battery voltage is the battery voltage level 0 to write the level in the RAM 176. The CPU then advances to step ST15.

At step ST11, the CPU 175 verifies whether or not the voltage level at the mid point connection terminal X is smaller than the battery voltage level 2, that is whether or not the battery voltage level has transferred from level 2 to level 1. If the result of this check is YES, the CPU moves to step ST12 and, if otherwise, to step ST13.

At step ST12, the CPU 175 assumes that the current battery voltage is the battery voltage level 1 to write the level in the RAM 176. The CPU then advances to step ST15.

At step ST13, the CPU 175 verifies whether or not the voltage level at the mid point connection terminal X is smaller than the battery voltage level 3, that is whether or not the battery voltage level has transferred from level 3 to level 2. If the result of this check is YES, the CPU moves to step ST14 and, if otherwise, it terminates the processing.

At step ST14, the CPU 175 assumes that the current battery voltage is the battery voltage level 0 to write the level in the RAM 176. The CPU then advances to step ST15.

At step ST15, the CPU 75 counts up the number of cycles of the counter 175a by ⅓ to terminate the processing.

That is, the CPU 175 detects to which of the battery voltage levels the voltage level belongs at the time of charging and discharging, and counts up by ⅓ each time the voltage level is lowered due to discharging, such that any one of the three threshold values is exceeded. Thus, if the lithium ion secondary batteries are charged/discharged frequently, the number of cycles can be counted up responsive to the states of actual deterioration of the lithium ion secondary batteries.

The number of cycles is counted up each time the battery voltage level transfers from 3 to 2, from 2 to 1 and from 1 to 0. If, after the battery voltage level is 3 by charging, discharging occurs again, the number of cycles is counted up each time the battery voltage level transfers from 3 to 2 and from 2 to 1. If, charging takes place again at the battery voltage level equal to 1, so that the battery voltage level transfers to 3, the discharging then taking place again, the number of cycles is counted up each time the battery voltage level number is decremented. Meanwhile, one-third of the number of cycles shown in FIG. 10 represents the actual number of cycles.

If the number of cycles of the counter 175a of the CPU 175 exceeds the maximum number of charging/discharging counts of the lithium ion batteries 171, 172, it may be assumed that the lithium ion batteries 171, 172 have been deteriorated and the service life thereof has come to an end.

In the present embodiment the battery voltage level is divided into four stages. Alternatively, the battery voltage level can be divided into n (>2) stages and the number of cycles can be counted up each time one of the (n−1) thresholds has been exceeded.

Also, in the present embodiment, the number of cycles is counted up as the voltage level is lowered, that is during discharging. Alternatively, the number of cycles can be counted as the voltage level is increased, that is during charging. Still alternatively, the number of cycles can be counted both during charging and discharging.

The integrated residual battery voltage value, stored in the ROM 177, is hereinafter explained. The integrated residual battery voltage [mAh] that can be discharged at the time of 90% charging, referred to below as the 90% integrated residual value, is stored in the ROM 177 for each cycle number, as shown in FIG. 11. Here, the 90% integrated residual value is stored at an interval of 10 cycles, specifically for the numbers of cycles from 0 to 10, from 11 to 20, from 21 to 30, . . .

For example, the 90% integrated residual value from 11 to 20 cycles is the 90% integrated residual value for 0 to 10 cycles less the deteriorated capacity of the lithium ion batteries 171, 172 caused by the 11 to 20 cycles. Similarly, the 90% integrated residual value from 11 to 20 cycles is the 90% integrated residual value for 0 to 10 cycles less the deteriorated capacity of the lithium ion batteries 171, 172 caused by the 21 to 30 cycles.

Thus, if the residual battery value is computed in discharging, based on the initial value of the integrated residual battery value, the battery pack 1 is able to make calculations using the 90% integrated residual value as set based on the number of cycles. That is, since the 90% integrated residual value, as an initial value for calculating the residual battery value, can be set in keeping with the deterioration due to charging/discharging of the lithium ion batteries 171, 172, the residual battery value can be calculated more accurately than with the conventional method.

The 90% integrated residual value may also be stored in the ROM 177 every 32 cycles, as shown in FIG. 12. For example, the non-corrected 90% integrated residual value is stored as the reference capacity if the number of cycles is not less than 0 and not more than 32, the reference capacity less the correction data (constant value) is stored if the number of cycles is not less than 32 and not more than 64, the reference capacity less twice the correction data is stored if the number of cycles is not less than 48 and not more than 96 and the reference capacity less thrice the correction data is stored if the number of cycles is not less than 96 and not more than 128. That is, if the deteriorated capacity is linear, the 90% integrated residual value may be stored in accordance with this algorithm.

With the above-described battery pack and the number of counting the charging/discharging thereof, according to the present invention, in which the voltage is detected from the chargeable/dischargeable battery cell, plural battery voltage levels are set and the number of times the detected voltage has transferred to different voltage levels is counted, the number of cycles can be counted correctly, even if the battery cell is deteriorated due to charging/discharging, depending on the degree of deterioration of the battery cell.

With the battery pack and the residual battery capacity setting method, according to the present invention, in which the integrated residual battery capacity on charging to a pre-set proportion relative to the full charging of the chargeable/dischargeable battery cell is stored in memory means at an interval of a pre-set number of cycles, the number of times the battery cell has been charged/discharged is counted and the stored integrated residual battery capacity for the pre-set number of cycles in the memory means corresponding to the number of counts by the counter is set as the residual battery capacity on full charging of the battery cell, the value of the integrated residual battery capacity on charging to the pre-set proportion corresponding to the number of cycles can be set. Since this enables the initial value on charging to be set in keeping with deterioration caused by charging/discharging of the battery cell, the residual battery capacity can be calculated more accurately than with the conventional battery pack.

FIG. 13 shows a specified circuit structure of the battery pack 1.

The battery pack 1 is made up of a battery cell block 70, having two battery cells, and a battery protection circuit block 80 for protecting the battery cell block 70 against overcharging or overdischarging.

The battery cell block 70 includes lithium ion batteries 71, 72, as two battery cells, connected in series with each other, and a temperature sensor 76 for detecting the temperature of the lithium ion batteries 71, 72. The positive electrodes and the negative electrodes of the lithium ion batteries 71, 72 are connected to a positive terminal 73 and to a negative terminal 74, respectively. The junction point of the lithium ion batteries 71, 72 is connected to a neutral point potential terminal 75. A temperature sensor 76 detects the temperature of the batteries 71, 72 to route the detected results to the battery protection circuit block 80.

The battery protection circuit block 80 includes a terminal VH, connected to the positive terminal 73, a terminal VSS, connected to the negative terminal 74, a terminal VL, connected to the neutral point potential terminal 75, resistors R1 to R6, for dividing the voltage across the respective terminals, a resistor R8 and a first switch S1.

The terminals VH, VL are connected to each other through series connected resistors R1 to R3. The combined resistance of the series connected resistors R1 to R3 is the resistance Rb1 which may, for example, be 20 MΩ.

The terminals VL, VSS are connected to each other through series connected resistors R4 to R6. The terminals VL, VSS are connected to each other through the resistor R8 and the first switch S1, connected in series with each other. Meanwhile, the combined resistance of the series-connected resistors R4 to R6 is Rb2 which may, for example, be 20 MΩ. That is, the resistance value of the resistor Rb1 is equal to that of the resistor Rb2. The resistance value of the resistor R8 is 390 kΩ which is appreciably smaller than the combined resistance of the resistors Rb1 and Rb2. The first switch S1 is usually off and is turned on only during the time a neutral point potential confirming control signal Ts is furnished.

The battery protection circuit block 80 includes first and second Zener diodes 81, 82 for generating reference voltages (where biasing resistors are not shown), first to fourth comparators 83 to 86 for detecting the potential difference between the respective resistors for detecting overcharging or overdischarging, a charging control circuit 89 for turning off a third switch $SW_C$ on overcharging and a discharging control circuit 90 for turning off a second switch $SW_D$ on overdischarging.

The first comparator 83 has its inverting input terminal connected to a cathode of the first Zener diode 81, while the anode of diode 81 is connected to the terminal VL. The first comparator 83 has its non-inverting input terminal connected to a junction point of the resistors R1, R2. The first comparator 83 detects whether or not the lithium ion battery 71 has been overcharged. The first comparator 83 outputs a logical H on detecting that the voltage Vb1 of the lithium ion battery 71 exceeds 4.25V, while outputting a logical L on detecting that the voltage Vb1 of the lithium ion battery 71 is less than 4.25V.

The second comparator 84 has its non-inverting input terminal connected to the cathode of the first Zener diode 81. The second comparator 84 has its inverting input terminal connected to a junction point between the resistors R2 and R3. The second comparator 84 detects whether the lithium ion battery 71 is in the overdischarging state. Thus, the second comparator 84 outputs a logical H if the voltage Vb1 of the lithium ion battery 71 is less than 2.45 V, while outputting a logical L if the voltage Vb1 is larger than 2.45 V.

The third comparator 85 has its inverting input terminal connected to a cathode of the second Zener diode 82, while the anode of diode 82 is connected to the terminal VSS. The third comparator 85 has its non-inverting input terminal connected to a junction point between the resistors R4 and R5. The third comparator 85 detects whether the lithium ion battery 72 is in the overcharging state. Thus, the third comparator 85 outputs a logical H on detecting that the voltage Vb2 of the lithium ion battery 72 exceeds 4.25V, while outputting a logical L if the voltage Vb2 is less than 4.25 V.

The fourth comparator 86 has its non-inverting input terminal connected to the cathode of the second Zener diode 82. The fourth comparator 86 has its inverting input terminal connected to a junction point between the resistors R5 and R6. The fourth comparator 86 detects whether the lithium ion battery 72 is in the overdischarging state. Specifically, the fourth comparator 86 outputs a logical H if the voltage Vb2 of the lithium ion battery 72 is less than 2.45 V, while outputting a logical L if the voltage Vb2 is larger than 2.45 V.

A first OR gate 87 takes the logical sum of the outputs of the first and third comparators 83, 85 to route the results to the charging control circuit 89. A second OR gate 88 takes the logical sum of the outputs of the second and fourth comparators 84, 86 to route the results to the discharging control circuit 90.

The charging control circuit 89 performs control to open and close the second switch $SW_C$ if fed with the logical H or with the logical L from the first OR gate 87, respectively. The discharging control circuit 90 performs control to control to open and close the third switch $SW_D$ if fed with the logical H or with the logical L from the second OR gate 88, respectively.

It is noted that the second and third switches $SW_D$, $SW_C$ are connected in series with each other. One of the second and third switches $SW_D$, $SW_C$ is connected to the second input/output terminal 22, while the other switch is connected through resistor R7 to the terminal VSS.

The battery pack 1 also includes a charging/discharging current detection circuit 91 for detecting whether the battery pack is charging or discharging, a micro-computer 92 for controlling turning on/off of the first switch S1 and a communication interface 93 for data transmission/reception with external device.

The charging/discharging current detection circuit 91 includes first and second operational amplifiers 911, 912, and resistors R11 to R16.

The first operational amplifier 911 has its non-inverting input terminal connected via resistor R13 to the terminal VSS, while having its inverting input terminal connected through resistors R12 and R7 to the terminal VSS. A resistor R11 is connected across the inverting input terminal and the output terminal of the first operational amplifier 911. When the discharging current flows through the resistor R7, the first operational amplifier 911 outputs a voltage proportionate to the resistance ratio of resistor R12 to resistor R11 to the micro-computer 92 and to a third OR gate 913. If the charging current flows through the resistor R7, the second operational amplifier 912 outputs a voltage proportionate to the resistance ratio of resistor R15 to resistor R14 to the micro-computer 92 and to a third OR gate 913. The third OR gate 913 takes the logical sum to supply the result to the micro-computer 92. That is, the charging/discharging current detection circuit 91 detects the direction of the current flowing through the resistor R7 to detect whether charging/discharging is going on and, if the charging or discharging is detected, the charging/discharging current detection circuit 91 routes the result to the micro-computer 92 while also routing the values of the charging current or the discharging current to the micro-computer 92.

The micro-computer 92 is programmed to wake up if charging/discharging has been detected by the charging/discharging current detection circuit 91 or if data has been received over a communication interface 93, and to sleep if otherwise. The micro-computer 92 also is programmed to enter into a sleeping state if no charging/discharging current flows or there is no data communication in two or three seconds after its actuation.

The micro-computer 92 substantially continuously detects the voltage of the terminal VL and also reads out optimum correction coefficients stored in the ROM 94, based on the temperature of the lithium ion batteries 71, 72 detected by the temperature sensor 76 to calculate the residual battery capacity of the lithium ion batteries 71, 72.

In the ROM 94 are stored not only the correction coefficients at an interval of 10° C., as discussed above in connection with FIG. 18, but also a control program for completing the correction coefficients or a control program for calculating the residual battery capacity.

The correction coefficients, at an interval of 10 C, stored in the ROM 94, are five correction coefficients, namely a correction coefficient 1 (=0.6) for 10° C. or lower, a correction coefficient 2 (=0.8) for 10 to 20° C., a correction coefficient 3 (=1.0) for 20 to 30° C., a correction coefficient 4 (=1.2) for 30 to 40° C. and a correction coefficient 5 (=1.4) for 40° C. or higher.

For calculating more detailed correction coefficients, based on these correction coefficients, the micro-computer 92 executes the processing as from step ST1 in the flowchart shown in FIG. 14. Here, the correction coefficient for 20 to 30° C. is taken as an example, the four correction coefficients are computed at an interval of 10° C.

At step ST101, the micro-computer 92 sets the correction coefficients stored in the ROM 94 as correction coefficient 3-3 for 25.0 to 27.5° C. That is, the correction coefficient 3-3 is set to 1.0. The micro-computer 92 then advances to step ST102.

At this step ST102, the micro-computer 92 calculates the correction coefficient 3-1 at 20.0 to 22.5° C. from the correction coefficients 2 and 3 stored in the ROM 94. The micro-computer 92 transfers to the subroutine processing shown in FIG. 15 to calculate the center of the two correction coefficients (step ST11). Specifically, the micro-computer 92 computes 0.9, as a median value of the correction coefficients 2, 3, to set the correction coefficient 3-1 to 0.9. The micro-computer then advances to step ST3.

At step ST3, the micro-computer 92 executes the subroutine of step ST111 shown in FIG. 15 in order to compute the correction coefficient 3-2 for 22.5 to 25.0° C. from the correction coefficients 3-1 to 3-3. That is, the micro-computer 92 sets a median value 0.95 of the correction coefficient 3-1 (=0.9) and the correction coefficient 3-3 (=1.0) as the correction coefficient 3-2. The microcomputer 92 then advances to step ST104.

At this step ST104, the micro-computer 92 executes the subroutine of step ST111 of FIG. 15, in order to calculate the correction coefficient 4-1 for 30.0 to 32.5° C. from the correction coefficients 3 and 4 stored in the ROM 94. That is, the micro-computer 92 sets a median value 1.1 of the correction coefficients 3 and 4 as the correction coefficient 4-1. The micro-computer 92 then advances to step ST105.

At step ST105, the micro-computer 92 executes the subroutine of step ST111 of FIG. 15, in order to calculate the correction coefficient 3-4 for 27.5 to 30.0° C. from the correction coefficients 3-3 and 4-1. That is, the microcomputer 92 sets a median value 1.05 of the correction coefficients 3-3 and 4-1 as the correction coefficient 3-4. The micro-computer 92 then terminates the processing.

By the above processing, the micro-computer 92 acquires the correction coefficient 3-1 (=0.90) for the temperature of 20.0 to 22.5° C., the correction coefficient 3-2 (=0.95) for 22.5 to 25.0° C., the correction coefficient 3-3 (=1.0) for 27.5 to 30.0° C. and the correction coefficient 4-1 (=1.1) for 30.0 to 32.5° C., as shown in FIG. 16.

The micro-computer 92 performs similar processing for the temperature range other than 20.0 to 30.0° C. to calculate the correction coefficient at an interval of 2.5° C., as shown in FIG. 17.

Since the micro-computer 92 is able to use these correction coefficients at small step width, it is able to compute the residual battery capacity accurately, based on the voltage at the terminal VL, even if the lithium ion batteries 71, 72 undergo temperature changes.

If the micro-computer 92 has computed the correction coefficients corresponding to the temperature detected by the temperature sensor 76 when it is performing the processing of steps ST101 ff., shown in FIG. 14, the micro-computer is able to interrupt the processing to use the correction coefficients to calculate the residual battery capacity.

For example, if the micro-computer 92 has detected the temperature of 26° C., the micro-computer 92 acquires the correction coefficient 3-3 (=1.0) for 25.0 to 27.5 at a time point it has performed the processing of step ST101. The micro-computer 92 can then halt the processing as from step ST102 to calculate the residual battery capacity.

Also, if the micro-computer 92 has detected 23° C., the micro-computer 92 is able to perform the processing of steps ST101 to ST103 to make accurate calculations of the residual battery capacity of the lithium ion batteries 71, 72 based on the correction coefficient 3-2 and the voltage at the terminal VL.

Meanwhile, the residual battery capacity can be calculated using a technique disclosed in Japanese Laying-Open Patent H-9-297166 without any particular limitations. It is however necessary that the technique used be one that calculates the residual battery capacity using a temperature-dependent correction coefficient or the voltages of the lithium ion batteries 71, 72.

With the battery pack 1, in which only necessary minimum correction coefficients are stored in the ROM 94, and in which, if the temperature of the lithium ion batteries 71, 72 is detected, the correction coefficient is calculated only for the range of the detected temperature, correction coefficients can be calculated accurately depending on changes in temperature.

Also, in the processing of steps ST102 to ST105, the subroutine processing shown in FIG. 15 is performed repeatedly. Thus, the optimum correction coefficient can be computed easily without performing complex processing.

In the present embodiment, explanation has been made on the assumption that the correction coefficients are stored at an interval of 10 C as shown in FIG. 18. However, the correction coefficients may previously be stored at an interval of 2.5° C., as shown in FIG. 17. Also, in the present embodiment, explanation has been made on the assumption that the range of 10° C. is divided into four stages such that the correction coefficients are calculated at an interval of 2.5 (=10/4)° C. It is, however, possible to divide the temperature range at finer steps to compute more detailed correction coefficients.

If, with the battery pack and the residual battery capacity computing method, according to the present invention, a correction coefficient associated with a temperature detected by the temperature detection means is stored in the storage means, the correction coefficient is read out and the residual battery capacity is computed based on the correction coefficient and the voltage detected by the voltage detection means. If a correction coefficient associated with the detected temperature is not stored in the storage means, a correction coefficient associated with a pre-set temperature ahead and at back of the detected temperature is read out from the storage means to compute a correction coefficient associated with the detected temperature based on each read-out correction coefficient to compute the residual battery capacity based on the computed correction coefficient and the voltage detected by the voltage detection means. Thus, if there is a temperature change in the battery cell, a correction coefficient can be acquired correctly in keeping with such change to enable the residual battery capacity to be computed accurately at all times.

What is claimed is:

1. A battery pack, comprising:
   a chargeable/dischargeable battery cell operable to produce a voltage between a minimum voltage level and a maximum voltage level;
   voltage detection means for detecting said voltage of said battery cell during charging/discharging; and
   a counter including means for setting a plurality of battery voltage levels between said minimum voltage level and said maximum voltage level, said counter for counting a number of times that said voltage as detected by said voltage detection means passes through any two or more of said plurality of battery voltage levels during at least one of charging and discharging.

2. The battery pack according to claim 1, further comprising: verifying means for verifying that a service life of said battery cell has come to an end when a number of counts by said counter has exceeded a maximum number of charging/discharging counts.

3. The battery pack according to claim 1, wherein said counter counts a number of times that said voltage as detected by said voltage detection means at least one of (i) increases through each of said plurality of battery voltage levels, and (ii) decreases through each of said plurality of battery voltage levels.

4. Amended) A method for counting charging/discharging cycles of a battery pack, comprising:
   detecting a voltage produced by a chargeable/dischargeable battery cell;
   setting a plurality of battery voltage levels between a minimum voltage level and a maximum voltage level of said battery cell; and
   counting a number of times that said detected voltage passes through any two or more of said battery voltage levels during at least one of charging and discharging to obtain a count.

5. The method according to claim 4, wherein verification that a service life of said battery cell has come to an end is obtained when said count has exceeded a maximum number of counts.

6. The method according to claim 4, wherein said count is one of (i) increased when said detected voltage has passed through one of said battery voltage levels; and (ii) decreased when said detected voltage has passed through one of said battery voltage levels.

7. A battery pack, comprising:
   a chargeable/dischargeable battery cell operable to produce a voltage between a minimum voltage level and a maximum voltage level;
   voltage detection means for detecting said voltage of said battery cell during charging/discharging; and
   storage means for storing a plurality of integrated residual battery capacity values representing magnitudes for charging to a pre-set proportion relative to full charging of said battery cell, each integrated residual battery capacity value corresponding to a pre-set number of charging/discharging cycles;
   a counter including means for counting a number of times that said voltage passes through at least one of a plurality of battery voltage levels during charging/discharging to obtain a count, said plurality of battery voltage levels being between a minimum voltage level and a maximum voltage level; and
   setting means for calculating a number of charging/discharging cycles from said count, and for setting an integrated residual battery capacity value for said battery cell by selecting one of said plurality of integrated residual battery capacity values stored in said storage means that corresponds to said charging/discharging cycles.

8. A method for setting a residual battery capacity of a battery pack, comprising:
   detecting a voltage produced by a battery cell;
   setting a plurality of battery voltage levels between a minimum voltage level and a maximum voltage level of said battery cell;
   counting a number of times that said detected voltage passes through at least one of said battery voltage levels during at least one of charging and discharging to obtain a count, said plurality of batter voltage levels being between said minimum voltage level and said maximum voltage level;
   calculating a number of charging/discharging cycles from said count; and
   setting an integrated residual battery capacity value for said battery cell by selecting one of a plurality of stored integrated residual battery capacity values that corresponds to said charging/discharging cycles, said plurality of integrated residual battery capacity values representing when a chargeable/dischargeable battery cell has been charged to a preset proportion relative to full charging of said chargeable/dischargeable battery cell.

9. A battery pack, comprising:
   at least one re-chargeable battery cell operable to produce a voltage between a minimum voltage level and a maximum voltage level;
   a voltage detector operable to measure said voltage;
   a processing unit operable to establish a plurality of voltage threshold levels between said minimum voltage level and said maximum voltage level and to compare said voltage against said voltage threshold levels; and
   a counter operable to advance a count as said voltage substantially reaches any two or more of said voltage threshold levels.

10. The battery pack of claim 9, wherein said counter advances said count at least one of: (i) only when said voltage falls substantially to each of said voltage threshold levels; (ii) only when said voltage rises substantially to each of said voltage threshold levels; and (iii) when said voltage rises or falls substantially to each of said voltage threshold levels.

11. The battery pack of claim 9, wherein said processing unit is further operable to compare said count against a maximum re-charging count, said comparison indicating that said at least one re-chargeable battery cell has substantially reached an end of service life when said count reaches said maximum re-charging count.

12. A battery pack, comprising:
   at least one re-chargeable battery cell operable to produce a voltage between a minimum voltage level and a maximum voltage level;
   a voltage detector operable to detect said voltage;
   a processing unit operable to establish a plurality of voltage threshold levels between said minimum voltage level and said maximum voltage level and to compare said voltage against said at least one voltage threshold level; and a counter operable to advance a count as said voltage substantially reaches any two or more of said voltage threshold levels, said processing unit being further operable to establish an integrated residual battery capacity for said at least one re-chargeable battery cell as a function of said count.

13. The battery pack of claim 12, wherein said processing unit is operable to reduce said integrated residual battery capacity as a function of said count.

14. The battery pack of claim 13, wherein said processing unit is operable to reduce said integrated residual battery capacity as a function of a predetermined advance in said count.

15. The battery pack of claim 12, further comprising a temperature detector operable to measure a temperature of said re-chargeable battery cell, wherein said processing unit is operable to (i) establish a correction coefficient based on said temperature, and (ii) establish said integrated residual battery capacity for said at least one re-chargeable battery cell as a function of said count and said correction coefficient.

16. The battery pack of claim 15, further comprising a memory operable to store a plurality of correction coefficients associated with corresponding temperatures, wherein said processing unit is operable to interpolate a correction coefficient when one of said stored plurality of correction coefficients does not correspond with said measured temperature.

17. The battery pack of claim 16, wherein said processing unit is operable to produce a plurality of interpolated correction coefficients based on, and falling between, two of said plurality of stored correction coefficients.

18. The battery pack of claim 17, wherein said processing unit is operable to produce a further plurality of interpolated correction coefficients based on, and falling between, two of said plurality of interpolated correction coefficients.

* * * * *

UNITED STATES PATENT AND TRADEMARK OFFICE
CERTIFICATE OF CORRECTION

PATENT NO. : 6,512,984 B1
DATED : January 28, 2003
INVENTOR(S) : Mamoru Suzuki and Hideyuki Sato It is certified that error appears in the above-identified patent and that said Letters Patent is hereby corrected as shown below:

Column 11,
Line 33, "The first" should become a paragraph immediately after "VL."

Column 16,
Line 21, "of batter voltage" should read -- of battery voltage --.

Signed and Sealed this

Fifth Day of April, 2005

JON W. DUDAS
*Director of the United States Patent and Trademark Office*